(12) United States Patent
Gilbert

(10) Patent No.: US 7,915,956 B2
(45) Date of Patent: *Mar. 29, 2011

(54) VECTOR MODULATOR HAVING ATTENUATORS WITH CONTINUOUS INPUT STEERING

(75) Inventor: Barrie Gilbert, Portland, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/954,533

(22) Filed: Dec. 12, 2007

(65) Prior Publication Data

US 2008/0143443 A1    Jun. 19, 2008

Related U.S. Application Data

(63) Continuation of application No. 11/102,481, filed on Apr. 7, 2005, now Pat. No. 7,323,933.

(51) Int. Cl.
*H03G 3/04* (2006.01)

(52) U.S. Cl. .................................. 330/284; 330/254

(58) Field of Classification Search .................. 330/284; 327/100, 306, 308; 333/81 R
See application file for complete search history.

(56) References Cited

U.S. PATENT DOCUMENTS

| | | | | |
|---|---|---|---|---|
| 4,810,949 A | * | 3/1989 | Schiemenz et al. | 323/354 |
| 4,973,918 A | * | 11/1990 | Schindler | 330/277 |
| 5,006,735 A | | 4/1991 | Taylor | |
| 5,012,203 A | | 4/1991 | Beyer et al. | |
| 5,077,541 A | * | 12/1991 | Gilbert | 330/284 |
| 5,355,103 A | | 10/1994 | Kozak | |
| 5,392,009 A | | 2/1995 | Talwar | |
| 5,432,478 A | | 7/1995 | Gilbert | |
| 5,548,838 A | | 8/1996 | Talwar et al. | |
| 5,572,166 A | | 11/1996 | Gilbert | |
| 5,684,431 A | | 11/1997 | Gilbert et al. | |
| 6,046,640 A | | 4/2000 | Brunner | |
| 6,049,250 A | * | 4/2000 | Kintis et al. | 330/54 |
| 6,429,720 B1 | | 8/2002 | Gilbert | |
| 6,433,640 B1 | * | 8/2002 | Pavio et al. | 330/295 |
| 6,445,248 B1 | | 9/2002 | Gilbert | |
| 6,489,849 B1 | | 12/2002 | Gilbert | |
| 6,680,640 B1 | | 1/2004 | Behzad | |
| 6,768,378 B2 | * | 7/2004 | Stengel et al. | 330/54 |
| 6,894,566 B2 | * | 5/2005 | Claveau et al. | 330/286 |
| 7,196,577 B2 | * | 3/2007 | Brunner | 330/86 |
| 7,276,972 B2 | * | 10/2007 | Kosugi et al. | 330/286 |
| 7,323,933 B2 | * | 1/2008 | Gilbert | 330/254 |
| 7,382,190 B2 | | 6/2008 | Gilbert | |
| 7,498,883 B2 | * | 3/2009 | Wu et al. | 330/286 |

OTHER PUBLICATIONS

Paul R. Gray and Robert G. Meyer, Analysis and Design of Analog Integrated Circuits (Third Edition), pp. 545-547 and pp. 582-583.
Editor: M.J.B. Scanlan, Modern Radar Techniques, pp. 63-69.
Analog Devices, 250 MHz-1000 MHz Quadrature Modulator AD8345, pp. 1-16, 2001.

(Continued)

*Primary Examiner* — Henry K Choe
(74) *Attorney, Agent, or Firm* — Marger Johnson & McCollom PC

(57) ABSTRACT

Variable attenuation systems having continuous input steering may be used to implement vector or quadrature modulators and vector multipliers. Discrete implementations of attenuators with continuous input steering may have two outputs which may be cross-connected to provide four-quadrant operation. A symmetrically driven center tap may provide improved zero-point accuracy.

10 Claims, 19 Drawing Sheets

OTHER PUBLICATIONS

Tyco Electronics M/A-Com, Inc., High IP3 Pin Diode Variable Attenuator 0.060-1.2 GHz, pp. 1-5, published 2003.
Centellax, Inc., UVD50SC DC to 50 GHz MMIC Low Power Voltage Controlled Attenuator Data Sheet, published 2003, 8 pages.
Gray and Meyer, Analysis and Design of Analog Integrated Circuits (Third Edition), 1993, John Wiley & Sons, Inc., pp. 196-227 and pp. 464-465.

* cited by examiner

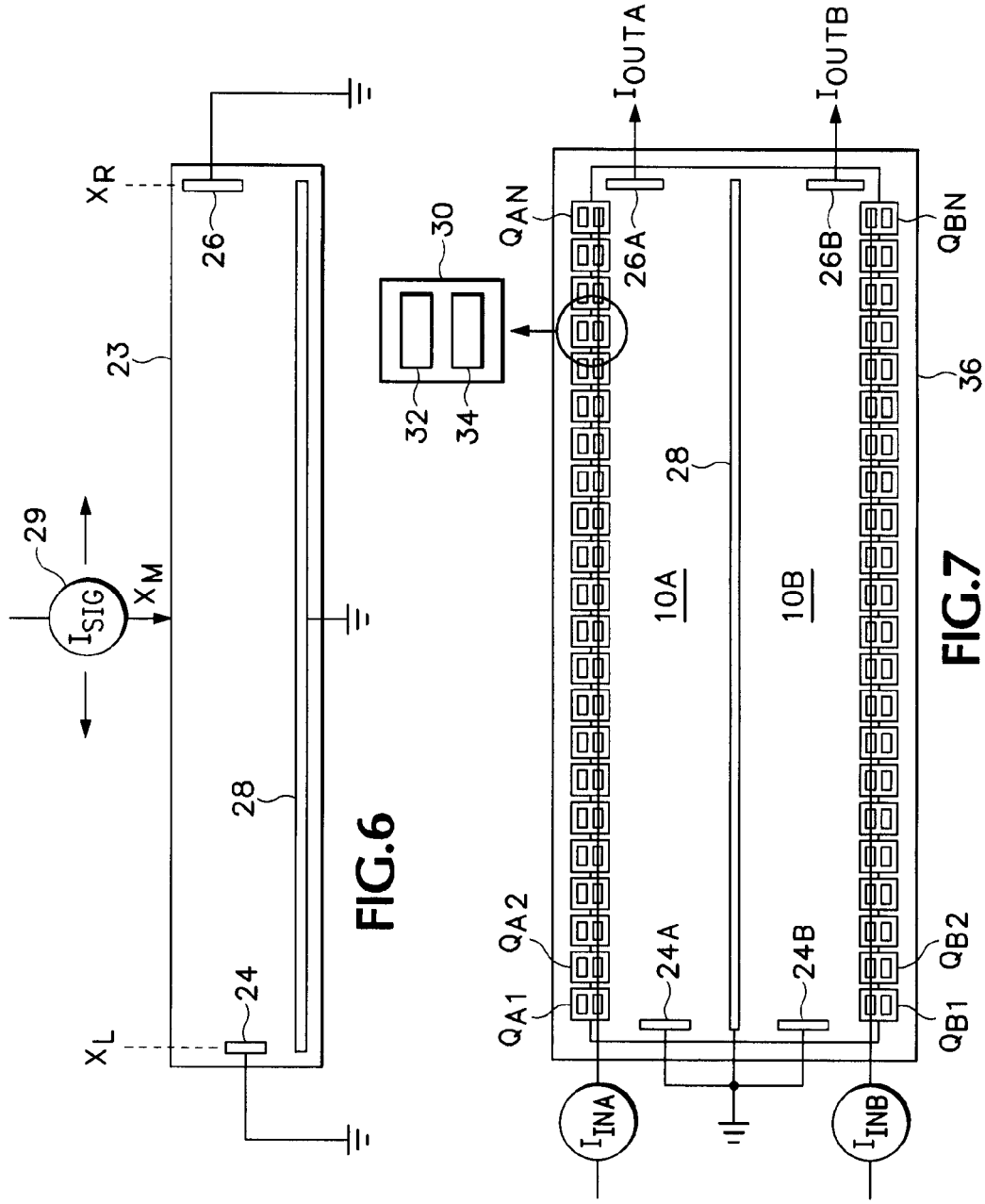

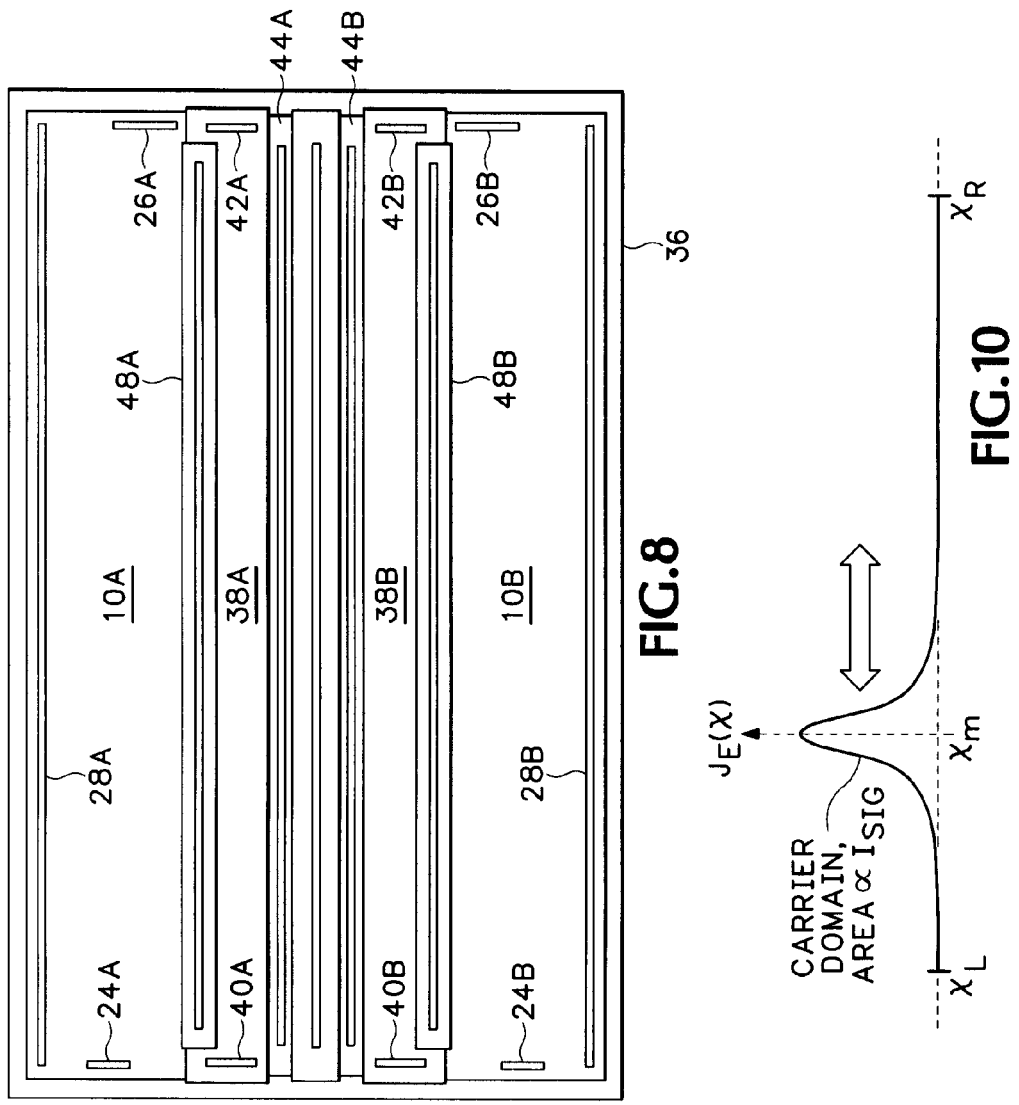

VECTOR MODULATOR HAVING ATTENUATORS WITH CONTINUOUS INPUT STEERING

This application is a continuation of U.S. patent application Ser. No. 11/102,481 filed Apr. 7, 2005 entitled Vector Modulator Having Attenuators With Continuous Input Steering, which is incorporated by reference.

BACKGROUND

FIG. 1 illustrates a prior art variable gain amplifier (VGA) based on a continuously interpolated attenuator. The circuit of FIG. 1 includes an attenuator network 100, a series of transconductance (gm) stages 102, an interpolator 104, a main amplifier 106, and associated support circuitry. The attenuator receives an input signal $V_{IN}$ and generates a series of progressively attenuated signals at a row of output tap points. Each gm stage is coupled to one of the tap points to receive one of the attenuated signals. The outputs from the gm stages are connected together and provided to the main amplifier so that the overall output signal is the sum of the output signals from all of the gm stages.

The interpolator steers a bias current $I_E$ to the gm stages as a series of interpolation signals $I_1 \ldots I_8$ in response to a control signal $V_{CTRL}$. When the highest gain is selected, all of the bias current $I_E$ is steered to the gm stage closest to the input end of the attenuator. Therefore, the first gm stage is active, and the remaining gm stages are effectively off. As the gain is reduced, the interpolator steers the bias current to gm stages further away from the input end of the attenuator, thereby selecting gm stages that receive progressively attenuated versions of the input signal. The gm stages are sequentially enabled and disabled in a continuous manner in which one of the interpolation signals gradually increases while the adjacent interpolation signal gradually decreases.

The VGA illustrated in FIG. 1 is generally intended to cope with varying input signals. That is, the domain of application is typically those situations where the input may have a very wide range of amplitudes, and where the system requires an output that is normalized to some constant value, which might be, for example, the full-scale capacity of an analog-to-digital converter. In the specialized field of variable gain amplifier design, such a structure has been called an "IVGA", meaning a VGA whose function addresses the wide range of signal amplitudes present at the input of the element. On the other hand, a structure that is expressly designed to accept an essentially constant input amplitude while providing an output signal of widely varying amplitude is called an "OVGA".

Some examples of interpolators used in variable gain amplifiers having interpolated attenuators are disclosed in U.S. Pat. Nos. 5,684,431 and 5,077,541, both having a common inventor with the present application. Another example of an interpolator is disclosed in U.S. Pat. No. 5,432,478 also having a common inventor with the present application.

BRIEF DESCRIPTION OF THE DRAWINGS

FIG. 6 illustrates an embodiment of an attenuator having a continuous structure in accordance with some of the inventive principles of this patent disclosure.

FIG. 7 illustrates an embodiment of a variable attenuation system having continuous attenuators and discrete steering cores in accordance with some of the inventive principles of this patent disclosure.

FIG. 8 illustrates an embodiment of a variable attenuation system in which both the attenuators and the steering cores are implemented as continuous structures in accordance with some of the inventive principles of this patent disclosure.

FIG. 10 illustrates the shape of the current density in a carrier domain that moves along the input of a continuous attenuator of FIG. 9.

DETAILED DESCRIPTION

Variable Attenuation Systems

Some of the inventive principles of this patent disclosure relate to variable attenuation systems having continuous input steering. These principles can be realized in myriad implementations, and the preferred embodiments are described below. For example, continuous input steering can be achieved by continuously interpolating a signal between the individual inputs of an attenuator constructed from discrete components. Alternatively, continuous input steering can be achieved by continuously steering the signal to different points on an attenuator having a continuous structure. Yet another possibility is to utilize a continuous attenuator, but then interpolate the input signal between discrete points on the attenuator.

Although not so limited, the variable attenuation systems described herein are generally intended for use in OVGAs; that is, variable gain amplifiers that accept an essentially constant input amplitude while providing an output signal of widely varying amplitude. While many of the basic VGA principles can be adapted to either the IVGA or OVGA function, there is little latitude in the particulars of the implementation where the performance demands are especially difficult to meet. Thus, while the variable attenuation systems and OVGAs described herein may appear to share some common features found in the IVGAs developed by the same inventor (e.g., U.S. Pat. Nos. 5,077,541; 5,684,431; 6,429,720; etc.), the differences are critical in a high-performance context.

Figure 1:
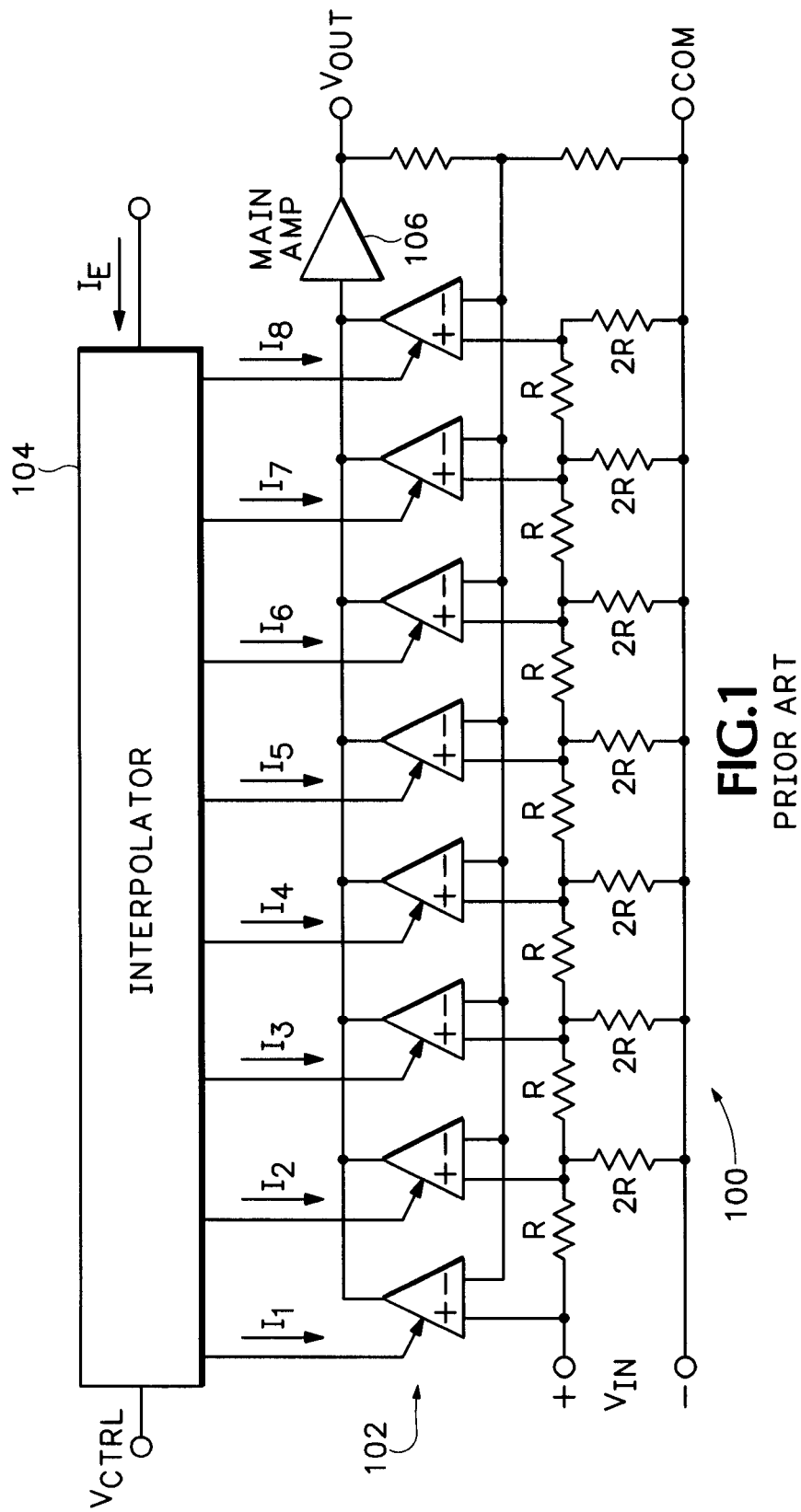
FIG. 1 illustrates a prior art variable gain amplifier based on a continuously interpolated attenuator.
Figure 2:
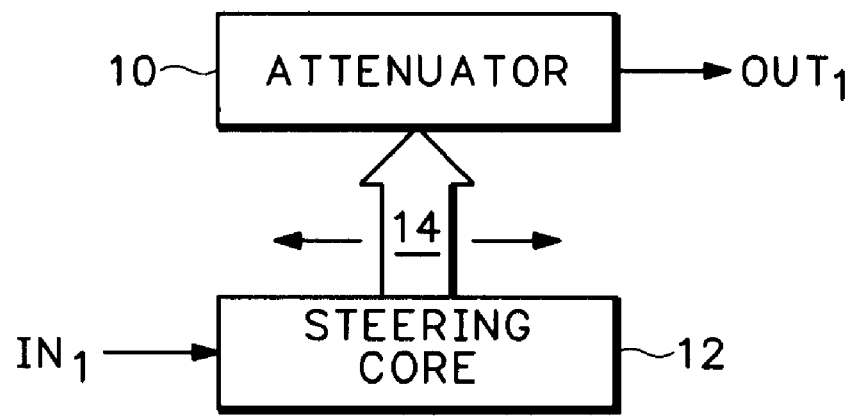
FIG. 2 illustrates a first embodiment of a variable attenuation system constructed in accordance with some of the inventive principles of this patent disclosure.

FIG. 2 illustrates a first embodiment of a variable attenuation system constructed in accordance with the inventive principles of this patent disclosure. The system shown in FIG. 2 includes an attenuator 10 having multiple inputs, and a steering core 12 that is constructed and arranged to continuously steer a signal $IN_1$ to the multiple inputs of the attenuator. This continuous steering action is represented by arrow 14, which is shown moving between different inputs of the attenuator. The output signal $OUT_1$ from the attenuator is an attenuated version of the input signal $IN_1$. The amount of attenuation depends on the point at which the signal is steered into the attenuator.

The term attenuation, as used herein, can refer not only to a reduction in the amplitude or power of a signal, but to an increase as well. For example, the steering core described above can be implemented in such a way as to amplify the input signal before steering it to an attenuator. Thus, the amplitude or power of the output signal might actually be greater than that of the input signal, depending on where the signal is steered along the attenuator.

Likewise, the term gain, as used herein, can refer not only to an increase in the amplitude or power of a signal, but to a decrease as well. For example, if gain is expressed as the ratio of output power to input power, then a system having lower output power than input power can be described as having a gain of less than one.

Figure 3:
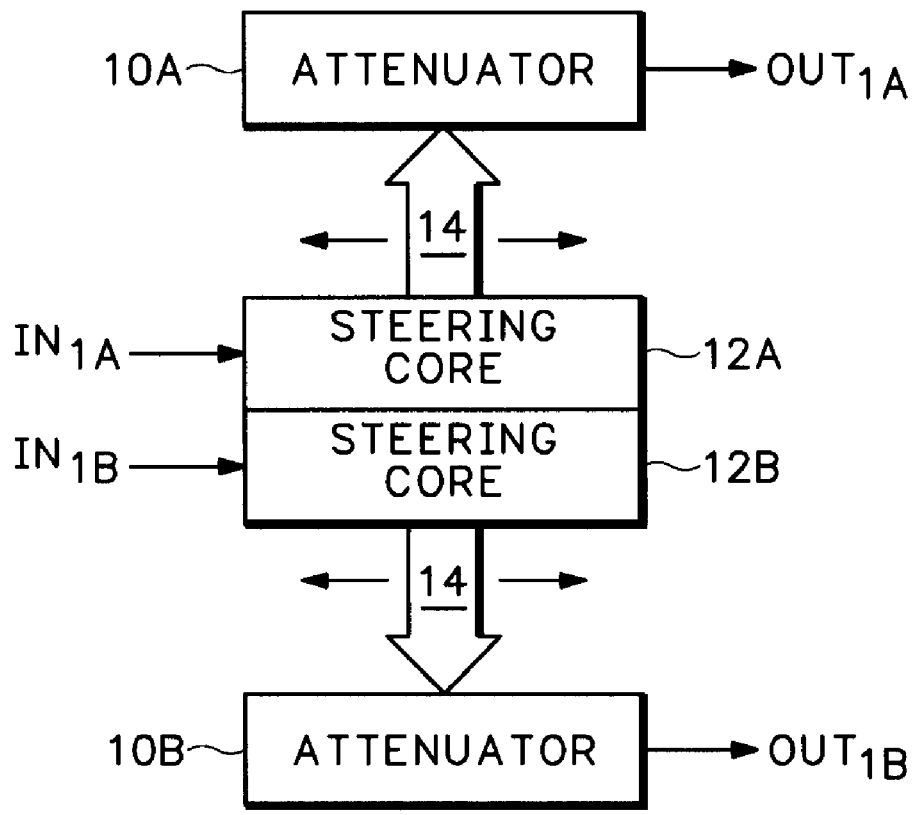
FIG. 3 illustrates a fully differential embodiment of a variable attenuation system in accordance with some of the inventive principles of this patent disclosure.

FIG. 3 illustrates a fully differential embodiment of a variable attenuation system in accordance with the inventive principles of this patent disclosure. The input signals $IN_{1A}$ and $IN_{1B}$ are applied to the steering cores 12A and 12B, which steer the signals to attenuators 10A and 10B. The amount of attenuation in the output signals $OUT_{1A}$ and $OUT_{1B}$ depends on the location at which the signals are steered into the attenuators. In the differential version of FIG. 3, the steering cores 12A and 12B can be thought of as two separate steering cores, or alternatively, as two half-sections of the same core. Likewise, the attenuators and input and output signals can be thought of as separate entities, or as two parts of a whole.

An advantage of the variable attenuation systems described above with respect to FIGS. 2 and 3 is that they can be easily configured to provide an output signal that varies over a wide range in response to an input signal that has a constant amplitude, as for example, the full-scale output from a digital-to-analog converter (DAC) or a modulator. That is, the system can operate as an OVGA.

Figure 4:
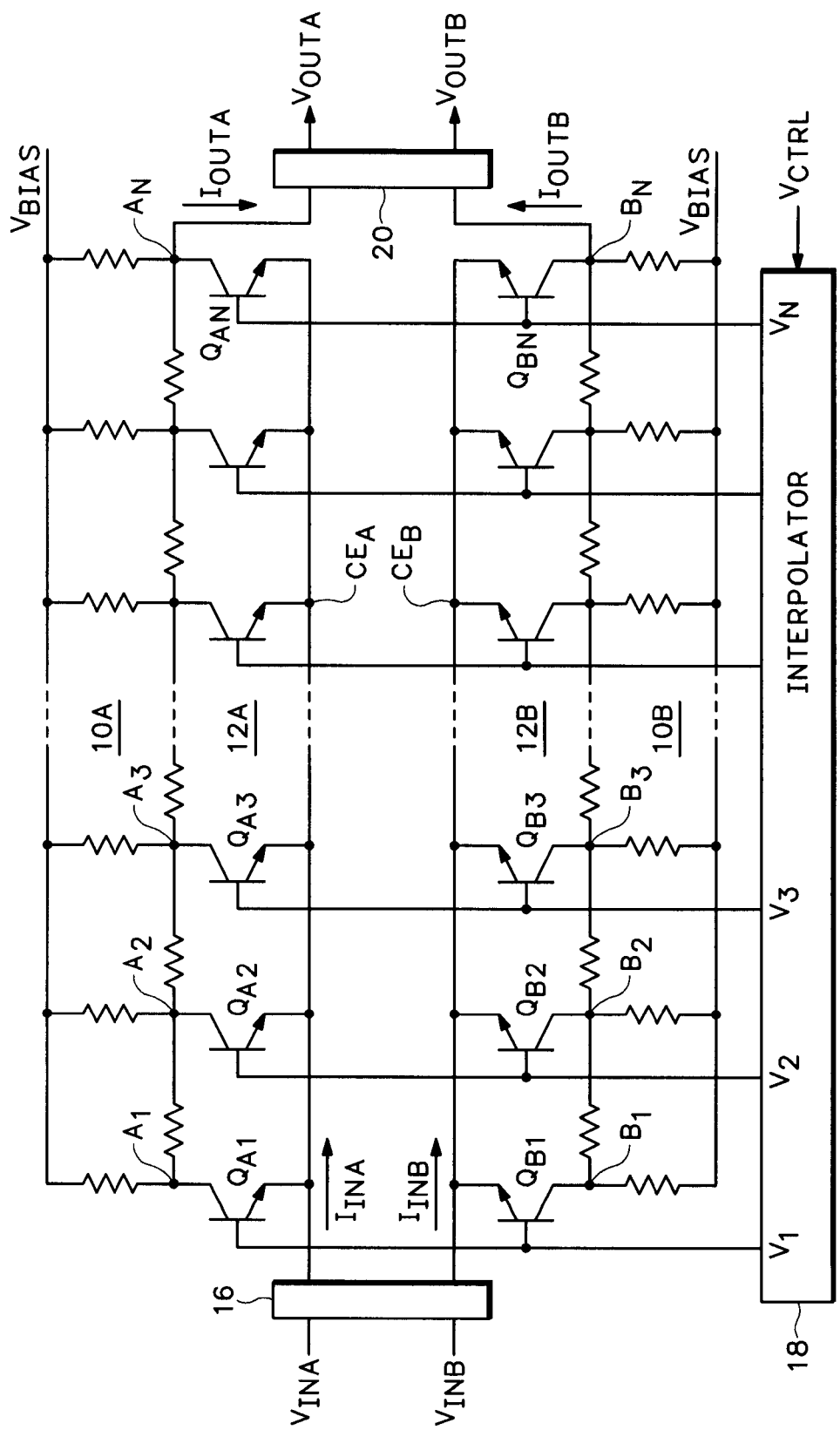
FIG. 4 illustrates a detailed embodiment of a variable gain amplifier constructed in accordance with some of the inventive principles of this patent disclosure.

FIG. 4 illustrates a detailed embodiment of a variable gain amplifier (VGA) constructed in accordance with some inventive principles of this patent disclosure. The circuit of FIG. 4 is a fully differential amplifier in which the attenuators have discrete inputs and the steering cores continuously interpolate between the discrete inputs.

The structure and operation of the circuit of FIG. 4 will be described beginning with the input signal which is applied as a differential voltage $V_{INA}, V_{INB}$ to a linear transconductance input stage 16. The input stage converts the input voltage to differential currents $I_{INA}, I_{INB}$ which are applied to common emitter nodes $CE_A$ and $CE_B$, respectively. Two series of steering transistors, in this case controlled cascode transistors, $Q_{A1}, Q_{A2}, \ldots Q_{An}$ (the "$Q_A$" transistors) and $Q_{B1}, Q_{B2}, \ldots Q_{Bn}$ (the "$Q_B$" transistors) are arranged in pairs to form the two steering cores 12A and 12B.

The emitters of the $Q_A$ transistors are connected together at common emitter node $CE_A$, whereas the emitters of the $Q_B$ transistors are connected together at common emitter node $CE_B$. Each of the collectors of transistors $Q_{A1}, Q_{A2}, \ldots Q_{An}$ is connected to a corresponding one of the attenuator inputs $A_1, A_2, \ldots A_n$. Likewise, each of the collectors of $Q_{B1}, Q_{B2}, \ldots Q_{Bn}$ is connected to a corresponding one of the attenuator inputs $B_1, B_2, \ldots B_n$.

An interpolator 18 generates a series of interpolation signals $V_1, V_2, \ldots V_n$ responsive to a gain control signal $V_{CTRL}$. The bases of each cascode transistor pair $Q_A$-$Q_B$ are connected together to receive a corresponding one of the interpolation signals. In this embodiment, the interpolation signals are voltage-mode signals.

The attenuators 10A and 10B are implemented as resistive ladder networks having input taps at $A_1, A_2, \ldots A_n$ and $B_1, B_2, \ldots B_n$ along one side of each ladder. The opposite sides of the ladders are anchored to a fixed voltage $V_{BIAS}$, which, for convenience, can be anchored to the power supply rail. The output from the attenuators is provided at the final tap points $A_n, B_n$ as a differential current $I_{OUTA}, I_{OUTB}$. This output current may then be converted to a differential output voltage $V_{OUTA}, V_{OUTB}$ by a transimpedance amplifier 20.

In operation, the cascode pairs steer the input currents $I_{INA}, I_{INB}$ to the input taps $A_1, A_2, \ldots A_n$ and $B_1, B_2, \ldots B_n$ under control of the interpolation signals $V_1, V_2, \ldots V_n$. As the gain is swept from one extreme to the other, the cascode pairs are sequentially enabled and disabled in a continuous manner in which one of the interpolation signals gradually increases while the adjacent interpolation signal gradually decreases. Thus, as $V_{CTRL}$ changes, a centroid or point of action can be envisioned as moving along the series of cascode pairs to provide continuous interpolation between the input taps. For any given gain setting (in general, other than an extreme minimum or maximum) multiple pairs of cascodes are enabled to varying degrees so that the distribution of the currents to different attenuator inputs is altered smoothly and continuously.

The ladder networks provide a constant impedance load to each of the cascode transistor pairs. The ladder networks could be constructed to provide a characteristic impedance of 50Ω at the outputs $A_n, B_n$ of the dual attenuators. If the ladder networks are implemented in the well-known R2R form, the gain varies exponentially (linear-in-dB) in response to linear changes in the gain control signal, with a difference of 6.02 dB between taps. However, this same exponential attenuation law is true for any resistor ratio.

The voltage output from the attenuators can actually be used as the final output, but such a configuration would not allow high amplitude operation. An output amplifier such as the transimpedance amplifier 20 can be arranged to provide large output amplitudes. An additional benefit of using an output amplifier is that it reduces the voltage swing at the collectors of the right-most cascode pairs.

The number of stages used for the attenuators and steering cores (i.e., the number of attenuator inputs and corresponding cascode pairs) is not critical, but it is often preferable to use a large number of stages. Increasing the number of stages reduces the amount of ripple in the gain function. It also reduces a particular type of distortion—sometimes referred to as contention distortion in this specialist field—which is attributable to the manner in which adjacent pairs of cascodes dynamically distribute fractions of the current to different attenuator inputs. In one example of a practical embodiment, 20 stages (21 pairs of cascodes), each providing 3.2 dB of attenuation, would cover a clear 60 dB gain span while providing 2 dB guard-bands at either end.

The circuit of FIG. 4 is an exemplary embodiment that is fully differential and implemented with bipolar junction transistors (BJTs), interpolation signals $V_1, V_2, \ldots V_n$ that are voltage-mode signals, and input signals $I_{INA}, I_{INB}$ that are current mode-signals. However, the inventive concepts are not limited to the specific details of the embodiment of FIG. 4. For example, the attenuators need not provide exponential attenuation, the input stage might be eliminated in some applications, and a single-sided implementation is possible. The steering core can be implemented with other types of transistors, and in fact, a benefit of the circuit shown in FIG. 4 is that it can be readily adapted to an all-CMOS process. Moreover, although the inventive principles of the circuit of FIG. 4 are illustrated in the context of a VGA, the variable attenuation system utilized therein has independent utility apart from its use in a VGA.

Although the particular implementation of the interpolator 18 is not critical, a special form known as a "dual-rank, spatially amplifying interpolator" is particularly well suited to this application because, among other reasons, it can be integrated into the steering core in a synergistic manner and it may provide a much finer division of the gain/attenuation range. Such an interpolator is described in U.S. Pat. No. 6,489,849 B1, also by the inventor of the present application.

A spatially amplifying interpolator has a first rank or layer of transistors that generate a series of partially switched currents. In this context, the term "switching" is used to refer, not to an abrupt change of state, but rather to a gradual transference of states over a set of elements, typically of 8 to 50 in number. A second layer of transistors spatially amplify the currents to reduce overlap and "sharpen" their geometry. Amongst other benefits, this allows the interpolator to operate at a reduced supply voltage. When such an interpolator is used with the circuit of FIG. 4, the cascode transistors in the steering core are utilized as the second layer of transistors and thereby perform the dual functions of signal steering and spatial amplification.

Figure 5:
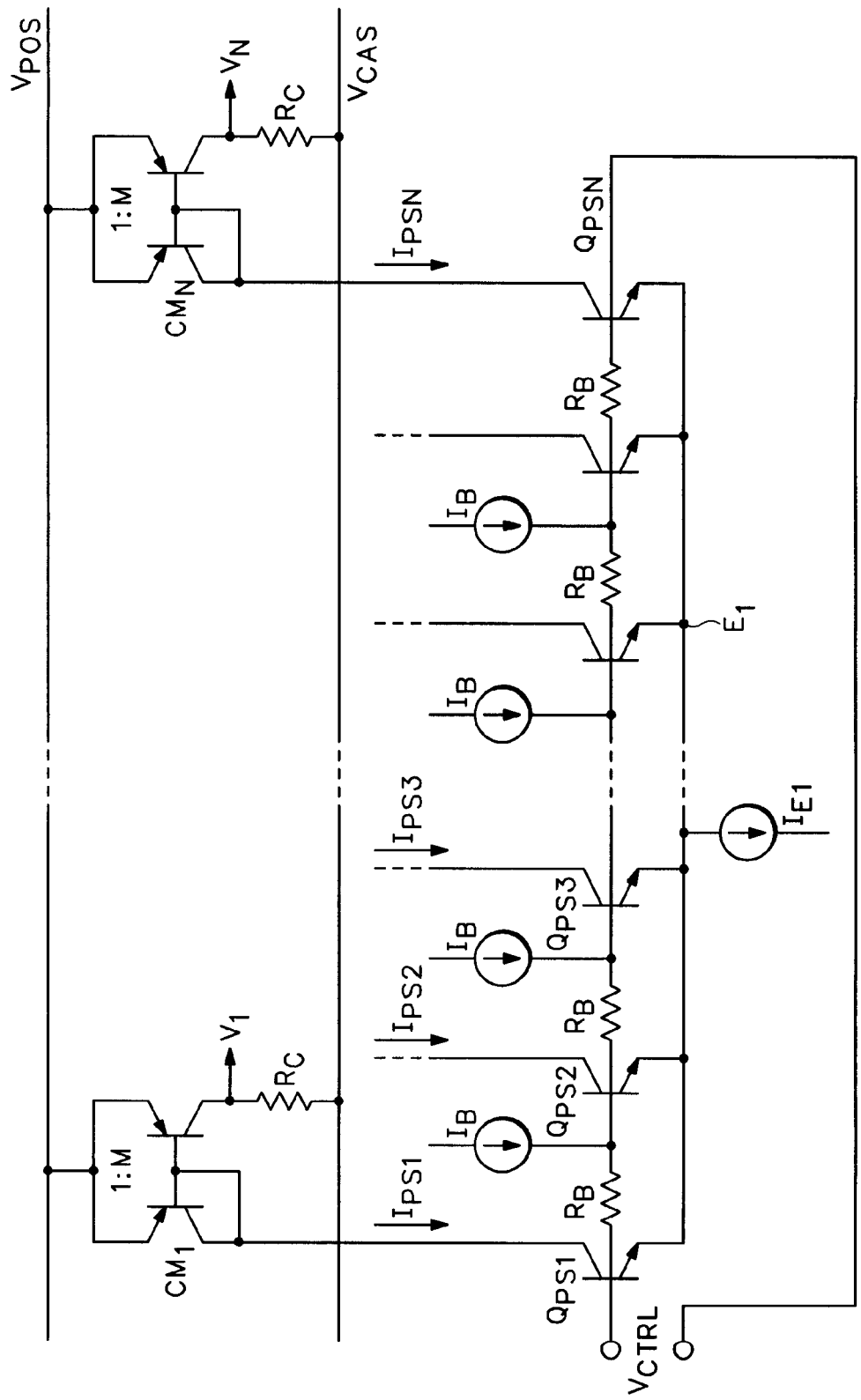
FIG. 5 illustrates an arrangement for integrating a steering core and an interpolator in accordance with some of the inventive principles of this patent disclosure.

FIG. 5 illustrates an embodiment of an arrangement for integrating a steering core and an interpolator in accordance with inventive principles of this patent disclosure. The interpolator includes a layer of partially switched transistors $Q_{PS1}, Q_{PS2}, \ldots Q_{PSn}$ that have their emitters connected together at node $E_1$ to receive a bias ("tail") current $I_{E1}$. The bases of the partially switched transistors are connected in a chain with a resistor $R_B$ between the bases of adjacent transistors, and a current source $I_B$ supplied to the base of each transistor. While it is common to use equal resistors and current sources, this is not an essential aspect of the interpolator. The gain control signal is applied as a differential voltage $V_{CTRL}$ between the bases of the outermost transistors $Q_{PS1}$ and $Q_{PSn}$.

The partially switched currents $I_{PS1}, I_{PS2}, \ldots I_{PSn}$ generated at the collectors of $Q_{PS1}, Q_{PS2}, \ldots Q_{PSn}$ are applied to a layer of current mirrors $CM_1, CM_2, \ldots CM_n$ having mirror gain M. The output currents from the current mirrors are converted to voltage signals $V_1, V_2, \ldots V_n$ by resistors $R_C$ and applied to the bases of the cascode transistor pairs (the $Q_A$-$Q_B$ pairs) in the steering cores 12A and 12B. In this basic arrangement, the current mirrors do not perform any spatial amplification. Instead, the function of the current mirrors is to simply convert the shallow, overlapping partially switched currents to voltage-mode form to drive the bases of the cascode pairs which perform the actual spatial amplification, i.e., current pulse sharpening, in the steering cores. The mirrors also provide a polarity change in these voltages.

Although the basic current mirrors do not directly perform the spatial amplification, the effective degree of sharpening does depend on the mirror gain M and the value of resistors $R_C$, and these values can be optimized to minimize ripple in the gain function and/or contention distortion.

Alternatively, the current mirrors can be designed to provide some pre-sharpening by making the mirrors nonlinear, for example, through the use of emitter degeneration with nonstandard resistor values. Emitter degeneration is commonly used to improve the performance of a current mirror. In the standard arrangement, a resistor having a value R is inserted in series with the emitter of the diode-connected transistor which has an emitter area of "1". A resistor having a value of R/M is inserted in series with the other transistor which has an area of "M". This standard arrangement results in a mirror that produces an output current that is a linearly scaled by a factor of M from the input current. By deviating from the standard resistor values, however, the mirror output can be made nonlinear in an expanding manner to provide spatial amplification to the interpolation signals.

As another alternative, the current mirrors can in certain cases be omitted entirely by converting the partially switched currents directly to voltages and applying them to the bases of the cascode transistors, provided the required polarity is preserved.

Thus, in cases where the cascodes in the steering core are NPN bipolar transistors or NMOS transistors, the selection of one pair of these cascodes requires that their bases (gates) be relatively more positive than the adjacent transistors. For the bipolar case, a voltage difference of only 120 mV will divert 99 percent of the primary current applied to the common emitter rails (that is, both the DC bias current and the differential signal currents present on these inputs).

It will be apparent that increasing the general amplitude of the steering voltages does not materially affect the left-right location of the selected cascode pair, but does affect the acuity of this selection. If the base voltages vary only slightly as the interpolator moves the selection point from left to right, the alteration function will be "smeared", since several cascodes will be conducting to varying degrees. On the other hand, if the base voltages vary too greatly in amplitude, the effect will eventually be that each cascode pair is selected uniquely, and the transition from one pair to the next will occur in an undesirably abrupt fashion.

The amplitude of the interpolation signals $V_1, V_2, \ldots V_n$ can be made proportional to absolute temperature ("PTAT") to partially compensate for temperature changes in the system. Alternatively, the interpolation signals can be given a super-PTAT characteristic (that is, the interpolation signals change more rapidly with temperature). This design detail may ensure a constant gain ripple (that fine-scale deviation from the ideal gain law) at operating temperature extremes.

FIG. 6 illustrates an embodiment of an attenuator having a continuous structure in accordance with another separate inventive principle of this patent disclosure. The attenuator shown in FIG. 6 is built on a layer of resistive material 23, preferably a thin, uniform sheet, having specially positioned termination contacts 24 and 26 at opposite ends and a grounding contact 28 along the bottom of the attenuator.

In the simplest explanation, a signal current $I_{SIG}$ is assumed to enter the structure at a general point $x_m$ along the top of the attenuator between left extreme $x_L$ and right extreme $x_R$. In this example, the distance from $x_R$ to $x_L$ is 74 units, and the right extreme is defined as $x_R=0$. The left contact 24 provides accurate termination of the left end of the attenuator which causes it to behave as though it has infinite length to the left. The short circuit at the right contact 28 simulates the input of an ideal transresistance stage that would preferably be used to convert the current leaving the sheet at this point into a corresponding output voltage.

From the point of entry at $x=x_m$, the signal current spreads into the resistive layer. When $x_m$ is at the left extreme, nearly all of the input signal current flows into the left contact 24 and the ground contact 28. However, a small fraction $I_{OUT}$ also flows out of the right contact 26. As the point of entry moves to the right, more of the signal current flows out of the right contact 26. When $x_m=x_R$, $I_{OUT}$ is almost equal to $I_{SIG}$. In a preferred embodiment, the attenuator has an overall length of 74 units and a width of 12 units (these numbers including contact areas) which provides a 70 dB attenuation range. This structure behaves essentially as a discrete ladder attenuator, providing a input output relationship as follows:

$$I_{OUT}=I_{SIG}\exp(-x_m/8.686)$$

where $2 \leq x_m \leq 72$. That is, from −2 dB at $x_m=x_R$ to −72 dB at $x_m=x_L$.

Although the contact 28 is referred to as a "grounding" contact, it need not always be connected to the "ground" or zero potential reference in a circuit; it simply provides a region of isopotential, and could for example, be the positive supply rail.

An advantage of the continuous attenuator structure is that it eliminates the wiring parasitics and matching errors associated with discrete resistors. Implemented, for example, as a 100-ohm (148×24 μm) SiCr layer on a thick underlying oxide, the total parasitic capacitance may be as low as 130 fF.

The signal current can be injected into the attenuator using different techniques. For example, if a discrete steering core is used, the current source 29 represents a group of signals that are continuously interpolated between discrete input points disposed along the top of the attenuator and having their centroid at $x_m$. As another example, a continuous steering core can be used, in which case the current source 29 represents a carrier domain that moves continuously along the top of the attenuator and has a centroid at $x_m$.

A continuous attenuator such as that shown in FIG. 6 can be used to implement a variable attenuation system such as those described above with respect to FIGS. 2 and 3 in "superintegrated" form. When used with a discrete steering core such as that shown in FIG. 4, the outputs from the cascode transistors could be wired from the collector contacts to corresponding contacts along the input (upper) edge of the resistive layer. Although this would be a workable solution, the input edge might have to be modified to accommodate the contacts which, as a practical matter, need to have large enough areas to ensure that the local voltage drops at the contacts are sufficiently low. Moreover, the introduction of discrete contacts changes the potential distribution of the resistive layer. Lot-to-lot variation due to contact-to-boundary misalignment might introduce random gain errors.

FIG. 7 illustrates an embodiment of a variable attenuation system having continuous attenuators and discrete steering cores in accordance with additional inventive principles of this patent disclosure, and which avoids the aforesaid problems. The two continuous attenuators 10A and 10B shown in FIG. 7 are fabricated as N-type buried layers which also function as the sub-collectors of the steering transistors $Q_{A1}$, $Q_{A2}, \ldots Q_{An}$ and $Q_{B1}, Q_{B2}, \ldots Q_{Bn}$ disposed along the upper edge of attenuator 10A and the lower edge of attenuator 10B, respectively. One of the unit transistors is enlarged to show the base box 30, the base contact 32, and the emitter 34, all of which are fabricated on top of the buried layer. Connections to the bases and emitters are made using conventional practices.

In this fully integrated structure, the emitters of the $Q_A$ transistors are connected together to receive the input current $I_{INA}$, and the emitters of the $Q_B$ transistors are connected together to receive the input current $I_{INB}$, which, together with $I_{INA}$, forms a differential input signal. The interpolation signals are applied to the bases of the $Q_A$-$Q_B$ pairs as voltages $V_1$, $V_2, \ldots V_n$. Base drive lines may permissibly cross over the entire structure to allow the basic interpolator to be located on just one side.

A grounding contact 28 is formed across the length of the entire buried layer and its vertical center to define the lower edge of attenuator 10A and the upper edge of attenuator 10B. Contacts 24A and 24B are located at the left ends of the attenuators and connected to ground so as to accurately terminate the attenuators. Contacts 26A and 26B are located at the right ends of the attenuators to provide exit points for the differential output currents $I_{OUTA}$ and $I_{OUTB}$.

An advantage of the device of FIG. 7 (a superintegrated structure) is that the steering cores are tightly integrated with the attenuators in a manner that not only preserves the desired current distribution in the resistive layers, but also avoids the large voltage drops at small-area contacts by distributing the collector currents over the largest possible area. The centroid of these collector currents acts as a delta-function of current injection just as it would if an ideal carrier domain moved continuously along the input edge of each attenuator, as presumed in FIG. 6.

In the embodiment of FIG. 7, the entire structure is formed in a single isolation trench having a boundary as shown at 36. This eliminates collector contacts through the down-diffusion, thereby incidentally providing a lower collector resistance $R_C$ and a lower substrate-collector capacitance $C_{JS}$ while almost eliminating the perimeter components normally formed by the trench wall in a silicon-on-insulator (SOI). Another important benefit of forming the entire structure in a single slab of semiconductor in a trench it that it provides isothermal operation for all of the devices. This would not be true, in general, for individual SOI transistors, whose thermal resistance can be as high as 15,000° C. per watt in a modern IC process for a minimum geometry transistor.

The circuit shown in FIG. 7 can be viewed as a "hybrid" system that utilizes an attenuator having a continuous structure, but a steering core having discrete transistors. An advantage of such a system is that it provides the benefits inherent in a continuous attenuator while still allowing the interpolator drive signals to the bases be shaped independently. It should also be noted that the absolute resistance of the buried layer is not critical. It should preferably be low enough to prevent internal time constants from affecting the overall corner frequency, yet not so low as to pose a problem for a transresistance output stage which will often be used in practice to convert the output currents into voltage signals. For example, a low attenuator resistance will cause the overall output noise to increase.

The attenuation system shown in FIG. 7 is shown as a fully differential circuit, but it could also be implemented as a single-sided arrangement. The inventive principles illustrated through the embodiment of the system of FIG. 7 do not depend on the specific details shown therein. For example, the attenuators need not be fabricated as a buried layer, and the entire structure can be fabricated using processes other than SOI. For example, CMOS adaptations based on these inventive principles are also readily devised.

FIG. 8 illustrates an advanced embodiment of a variable attenuation system using a BiCMOS realization in which both the attenuators and the steering cores are implemented as continuous structures in accordance with some additional inventive principles of this patent disclosure. This "superintegrated" structure shown in FIG. 8 is fabricated in a single isolation trench having a boundary as shown at 36. Two continuous attenuators 10A and 10B are located along opposite sides of the trench and fabricated as N-type buried layers having termination contacts 24A and 24B located at one end, and termination contacts 26A and 26B at the other end. Grounding contacts 28A and 28B are formed along the top and bottom of attenuators 10A and 10B, respectively. The approximate geometry shown in FIG. 8 typically provides a 60 dB attenuation range.

P-type regions 38A and 38B run the length of the trench adjacent to the bottom and top of attenuators 10A and 10B, respectively. These P-type regions function simultaneously as the bases of two distributed NPN transistors, as the drains of two distributed PMOS transistors, and as resistors. Base end contacts 40A and 42A are located at the ends of the base region 38A, while base end contacts 40B and 42B are located at the ends of the base region 38B.

Another P-type region 43 runs along the centerline of the trench and functions as the source for both of the distributed PMOS transistors. Two polysilicon regions 44A and 44B also run the length of the trench and function as the gates for the two distributed PMOS transistors.

Dual N-type emitter regions 48A and 48B are fabricated over the base regions 38A and 38B and sit along the lower and upper edges of attenuators 10A and 10B, respectively. The N-type emitters, the PMOS gates, and the PMOS source regions have contact metalization running along their lengths.

Figure 9:
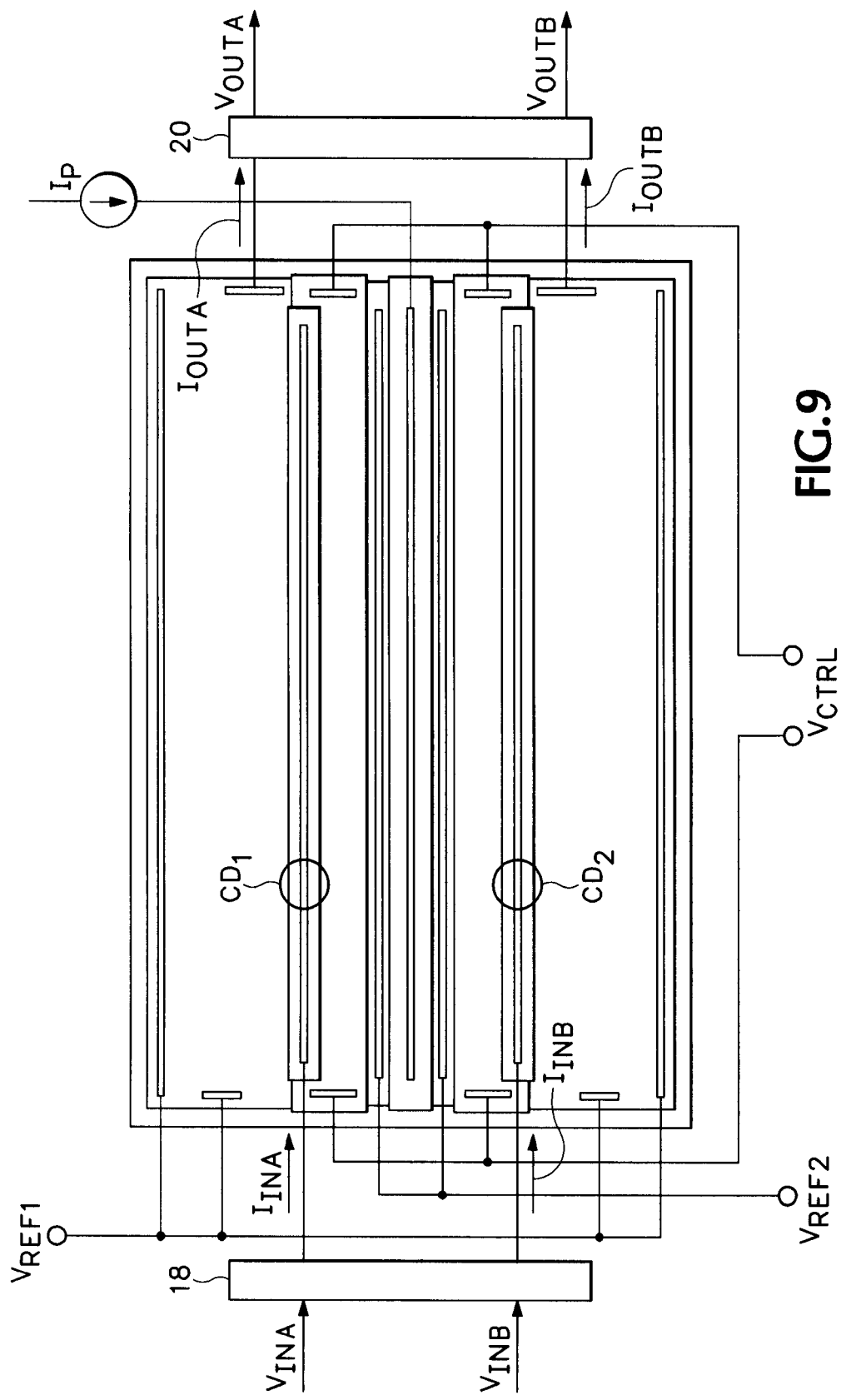
FIG. 9 illustrates an embodiment of a fully integrated variable gain amplifier in accordance with some of the inventive principles of this patent disclosure.

One technique for operating the attenuation system of FIG. 8 is shown in FIG. 9 which illustrates an embodiment of a VGA in accordance with some additional inventive principles of this patent disclosure. The attenuator grounding contacts and the termination contacts shown on the left side of the attenuator are all anchored to a fixed voltage $V_{REF1}$, typically a diode drop below the positive power supply voltage. The gates of the PMOS transistors are also anchored to a suitable voltage $V_{REF2}$. A suitably-scaled current $I_P$ is applied to the source region to set parabolic voltage profiles along the NPN base regions for implementing the gain control as described below.

A differential voltage input signal $V_{INA}$, $V_{INB}$ is converted to differential currents $I_{INA}$, $I_{INB}$ by a separate voltage-to-current (V-I) converter 18 such as, for example, a linear transconductance stage. The input differential currents $I_{INA}$, $I_{INB}$ are applied to the N-type emitter regions. The output signal is taken from the termination contacts at the right side of the attenuators as a differential current signal $I_{OUTA}$, $I_{OUTB}$ and then converted to a voltage output signal $V_{OUTA}$, $V_{OUTB}$ by a current-to-voltage (I-V) converter 20 such as a transimpedance stage.

The gain of the system of FIG. 9 is controlled by applying a steering signal, in this case a differential base drive voltage $V_{CTRL}$, between base contacts at either end of the base regions. The mechanism through which this is accomplished will now be described in more detail.

The distributed PMOS transistors function as current sources to set up current "sheets", having a constant line-density, flowing into the P-type base regions. The current sheets generate a parabolic voltage distribution in each base region by flowing laterally toward the left and right base contacts. The control voltages $V_{CTRL}$ move the maximum potential point $x_m$ of this voltage to the left or right. Since the voltage distribution always has a parabolic form, the location of $x_m$ is proportional to $V_{CTRL}$. That is, the location of the point of maximum potential can be accurately positioned along each base by changing the differential base voltage.

The current density in each emitter, all parts of which are held at the same potential by the continuous contact metalization, is greatest where the base voltage is highest. Because of the high transconductance of the distributed NPN transistor, the emitter current density falls very rapidly immediately to the left and right of the point of maximum potential. Thus, the point of maximum potential in each base defines the center or "centroid" of a region of localized current injection known as a "carrier domain." There are two such domains in this system.

Because the base voltage distribution is parabolic, the shape of the current density along the length of the base is essentially Gaussian as shown in FIG. 10. This outcome is due to the exponential relationship between the emitter current density $J_E(x)$ and the base voltage, of the form $-(x_m-x)^2$. That is, each carrier domain has a Gaussian distribution centered on $x_m$, the point of maximum potential in the base. The integral of the current density through the entire carrier domain is simply the value of the input current ($I_{INA}$ or $I_{INB}$) applied to the emitter region.

The current contained in the domain of minority-carrier injection flows downward into the buried layer attenuator where it splits, a fraction going to the right where it provides an output signal, contact and the remainder flowing to the AC grounded contacts. As discussed above with reference to the attenuator of FIG. 4, the amount of output current $I_{OUTA}$ and $I_{OUTB}$ flowing out of the right contacts bears an exponential relationship to the location of the carrier domains. Varying the control voltage $V_{CTRL}$ moves the carrier domains $CD_1$ and $CD_2$ along the edges of the attenuators, thereby providing "linear-in-dB" control of the gain. The embodiment shown in FIG. 9 typically provides about 60 dB of gain range.

A valuable aspect of using a carrier domain to inject signal current into an attenuator is that the centroid of injection is unaffected by temperature. Although the left-right shape of the carrier domain shown in FIG. 10 changes with temperature (it becomes taller and narrower at low temperatures and shorter and wider at high temperatures), the position of its centroid does not change with temperature. Also, the division of emitter current into the continuous attenuator is ratiometric: neither the amplitude of the input current to the emitter, nor the absolute resistance of the attenuator (which changes with temperature) influence the proportions of current that split to the left or right in the attenuator. Thus, the gain does not change with variations in temperature.

Another advantage of using a continuous structure is that it eliminates "contention distortion". The signal current is provided to the attenuator in a perfectly continuous manner, so there is no nonlinear contention in the division of signal currents between adjacent discrete cascode transistors.

A further benefit of the system of FIG. 9 is that it retains isothermal operation even when implemented with a SOI process having high thermal resistances. The entire structure is fabricated as a single area of crystalline semiconductor, and as the domains move back and forth, the high thermal conductance inside this area ensures that any local temperature undulations quickly diffuse throughout the entire area.

As with the other embodiments described above, the inventive principles illustrated through the example system of FIG. 9 are not limited to the details described therein. Other embodiments can realize the benefits of the inventive principles even if the system is not implemented as a fully differential system, the current distribution of the carrier domain is not Gaussian, the system is not implemented in structures that provide isothermal operation, etc.

Output Stage

Some additional inventive principles of this patent disclosure relate to output stages for amplifiers. The preferred embodiments are described below, but the inventive principles are not limited to the specific details of these embodiments.

The output signals from attenuators described above are generally current mode signals (although they are not pure currents because of the shunt impedance associated with the attenuator). In some applications, however, a voltage mode output is preferred, so a current-to-voltage (I-V) converter such as a transimpedance amplifier 20 is shown appended to the attenuator in some of the drawing figures discussed above.

Figure 11:
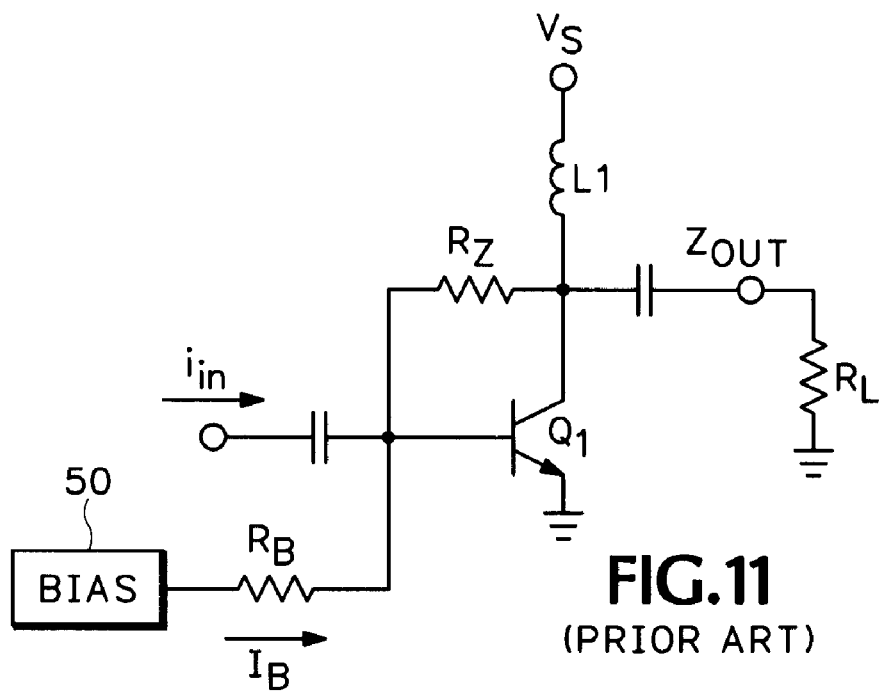
FIG. 11 illustrates a prior art transresistance amplifier.

FIG. 11 illustrates a classic transimpedance amplifier which is so named because its transfer function is expressed as a voltage (the output signal) divided by a current (the input signal), and therefore, has the dimensions of impedance. (In this case, the transimpedance amplifier is simply a transresistance amplifier because the transfer function is purely resistive, i.e., has no reactive component.) The circuit of FIG. 11 utilizes shunt feedback through resistor $R_Z$ to reduce the input impedance and transform the input current $i_{in}$ to a voltage $v_{out}$ at the output terminal. A bias circuit 50 maintains transistor Q1 at a suitable bias level by providing a bias current $I_B$ to the base of Q1 through a resistor $R_B$ which also functions as an AC blocking path. Because the collector of Q1 is coupled to the power supply $V_S$ through a choke L1, the available output voltage swing is almost twice the supply voltage (minus an allowance for the collector-emitter saturation voltage of Q1). Although shown here as a single-sided circuit, it can easily be implemented in a fully differential form. The circuit is reasonably accurate if the loop gain is high because the transfer function (in this case a transresistance) is then approximately equal to $R_Z$.

Although the circuit of FIG. 11 provides a workable solution in some applications, it suffers from numerous problems that prohibit its use in more demanding applications, especially, for example, where the circuit is required to provide relatively high output power at RF frequencies. Some of these problems are discussed below, and some additional inventive principles that may address these problems are presented.

One problem with the circuit of FIG. 11 is that it is difficult to bias the transistor accurately. If Q1 is biased by a voltage signal applied to its base, there is a possibility of thermal runaway, especially at high power levels, because the base-emitter voltage ($V_{BE}$) of Q1 drops as the temperature of the devices increases. This drop in $V_{BE}$ causes the bias current to increase which causes further heating of the device. Alternatively, if Q1 is biased by a current applied to its base, the variability in the current gain (beta) of Q1 causes unacceptable variations in the quiescent current through Q1.

Figure 12:
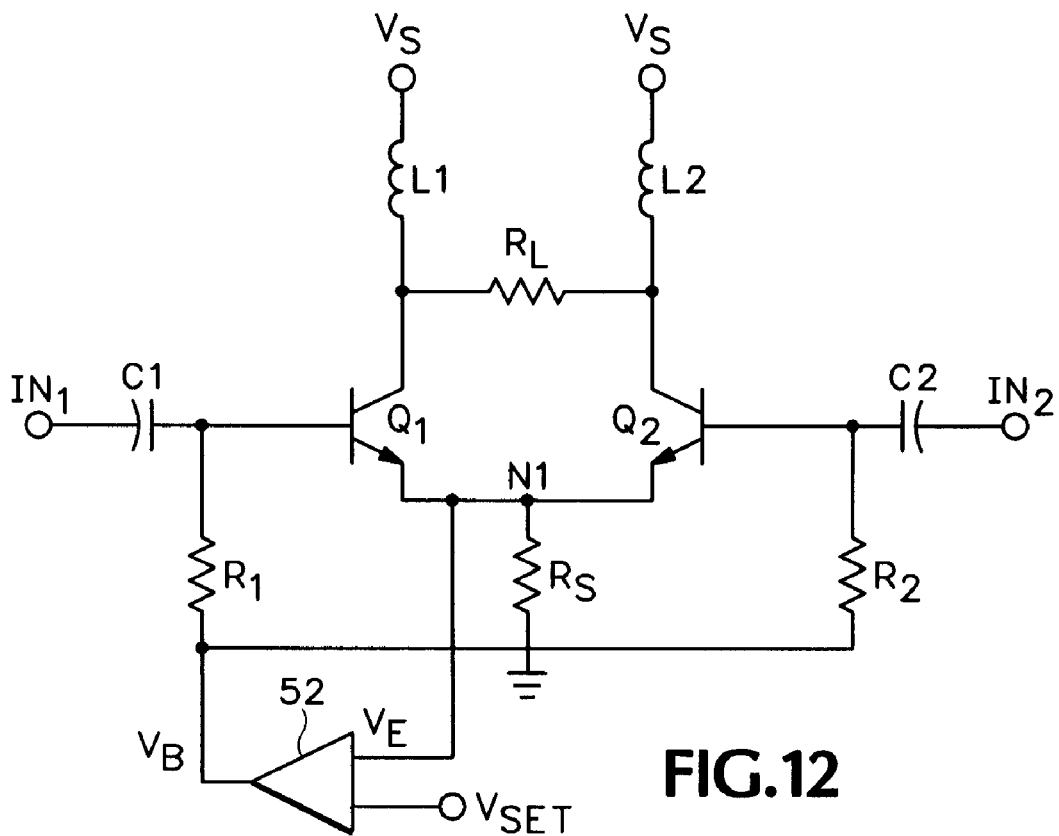
FIG. 12 illustrates an embodiment of an output stage constructed in accordance with some additional inventive principles of this patent disclosure.

FIG. 12 illustrates an embodiment of an output stage constructed in accordance with some additional inventive principles of this patent. This embodiment is shown in a fully differential form, but a single-sided version can be implemented using the same principles.

The embodiment of FIG. 12 senses the actual current through the amplifier and adjusts the bias signal to maintain the actual current at a controlled level. The input signal $IN_1$, $IN_2$ is applied to the bases of transistors Q1 and Q2 through AC coupling capacitors C1 and C2. The emitters of Q1 and Q2 are connected together at node N1. A biasing feedback network is arranged so that the actual current flowing through the amplifier is measured by sensing the voltage $V_E$ across a resistor $R_S$ which is connected between node N1 and ground. The biasing feedback network includes an operational amplifier (op amp) 52 which compares $V_E$ to a setpoint voltage $V_{SET}$ and drives the bases of Q1 and Q2 with a bias voltage $V_B$ through resistors R1 and R2, respectively. The op amp would typically be slow enough that it does not respond to the RF portion of the sense voltage $V_E$, but a low-pass filter can be inserted between N1 and the op amp for lower frequency applications.

An advantage of the embodiment of FIG. 12 is that the bias current through the amplifier can be controlled very accurately because the biasing feedback loop automatically compensates for variations in beta and other device parameters. Moreover, if the setpoint voltage $V_{SET}$ is made proportional to absolute temperature (PTAT), the transconductance (gm) of Q1 and Q2 is constant regardless of temperature, so the basic gain parameter is also constant with temperature. In a monolithic implementation, the $V_{SET}$ terminal can be brought out to a pin so that the user can take control of the bias level.

Referring back to FIG. 11, a further problem with a conventional transimpedance amplifier is high current consumption. If the circuit is arranged to drive a 50Ω load with a maximum 5V swing, transistor Q1 must have a minimum bias current of 100 mA. A fully differential version would require at least 100 mA in each side. Much of the time, however, the amplifier is not required to drive the load at maximum output power, so most of the bias current is wasted.

Therefore, another inventive principle is to adaptively bias the output amplifier so that it consumes only as much bias current as is necessary to match the gain requirement of the stage preceding the amplifier.

Figure 13:
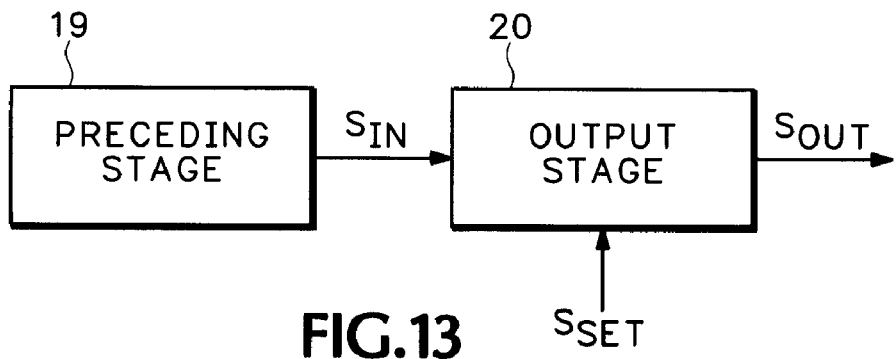
FIG. 13 illustrates an embodiment of an output stage having adaptive biasing in accordance with some additional inventive principles of this patent disclosure.

This principle is illustrated in FIG. 13 which is a block diagram of an embodiment of an amplifier having an output stage with adaptive biasing. The output stage 20 amplifies the input signal $S_{IN}$ received from the preceding stage 19 to generate the output signal $S_{OUT}$. The bias current through the output stage is controlled by the adaptive bias control signal $S_{SET}$ which can be generated in numerous different ways. A signal suitable for use as the adaptive bias control signal might be available internally in the preceding stage, it might be generated in a gain control interface used to drive the preceding stage, or it might be generated through some other scheme.

Conveniently, the embodiment of a closed loop bias control scheme illustrated in FIG. 12 can be used to implement the adaptive bias control technique shown in FIG. 13 because an adaptive bias control signal can be applied to the $V_{SET}$ input, and the circuit of FIG. 12 will then accurately and automatically control the bias to the desired setpoint. However, other apparatus can also be utilized to implement this adaptive biasing technique which is not limited to embodiments that provide closed loop control.

The principle of adaptively biasing the output stage can be used in combination with one of the variable attenuation systems described above. For example, if the preceding stage is based on an interpolator such as that shown in FIG. 4, the adaptive bias control signal can be obtained by performing a series of summations of the last few interpolation signals leading up to and including $V_N$. This produces an adaptive bias control signal that increases progressively (albeit, with some ripple due to the individual pulses from the interpolator) as the gain control signal $V_{CTRL}$ increases.

Figure 14:
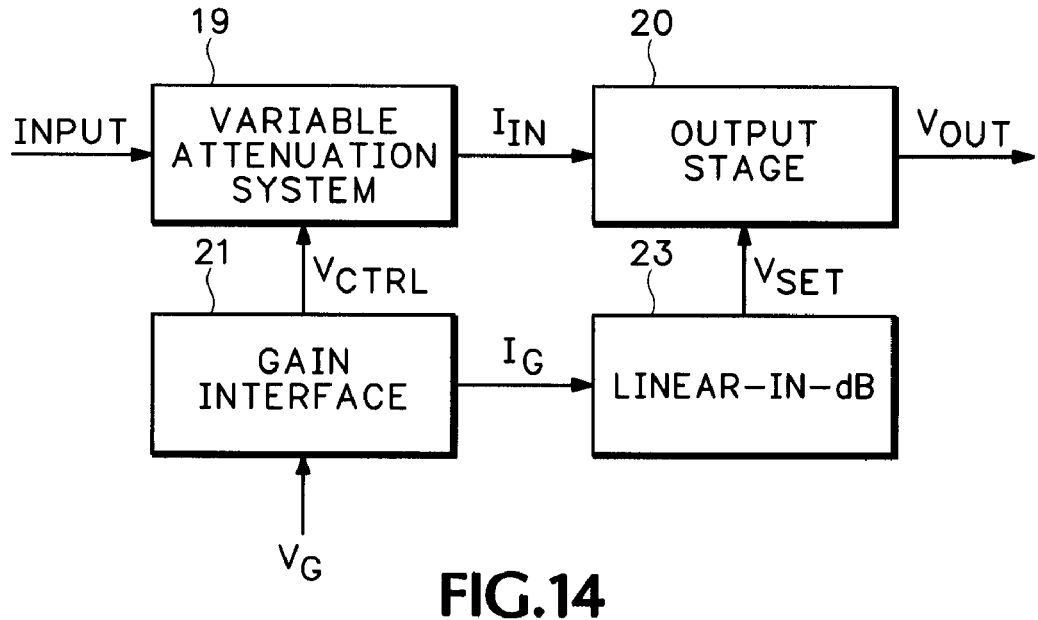
FIG. 14 illustrates an embodiment of a system that combines a variable attenuation system with an output stage having adaptive bias control in accordance with some additional inventive principles of this patent disclosure.

FIG. 14 illustrates an embodiment of a system that combines the inventive principles of a variable attenuation system and an output stage having adaptive bias control. The variable attenuation system 19 can be any of the variable attenuation systems described above. The gain control interface 21 is preferably a ratiometric current generator as described below.

Figure 15:
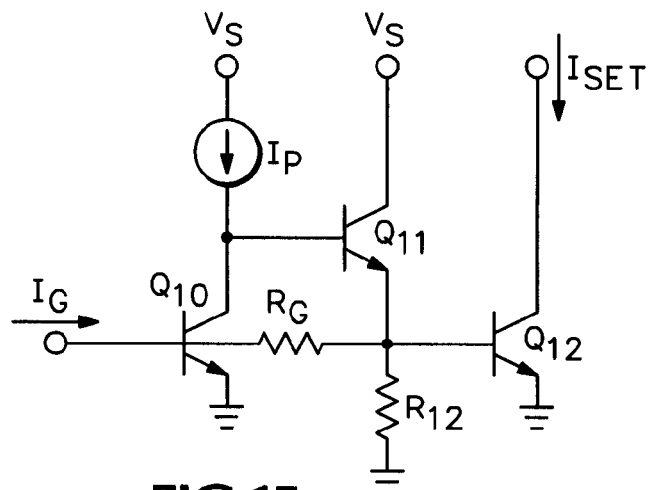
FIG. 15 illustrates a prior art exponential cell.

In the embodiment of FIG. 14, the adaptive bias control signal is implemented using an exponential (linear-in-dB) cell 23 as disclosed in U.S. Pat. No. 5,572,166 titled "Linear-in-Decibel Variable Gain Amplifier" by the inventor of the present application. An embodiment of such an exponential cell is illustrated in FIG. 15. A linear change in the input signal $I_G$ produces an exponential change in the output signal $I_{SET}$, which can then be easily transformed into a voltage mode signal and used as the adaptive bias control signal $V_{SET}$. If the input signal $I_G$ is derived from the gain control signal $V_{CTRL}$ used to control the interpolator 18 in FIG. 4, the bias current in the amplifier of FIG. 12 can be made to match the gain requirement of the variable attenuation system of FIG. 4, which may also provide a linear-in-dB gain characteristic.

An additional benefit of the exponential cell shown in FIG. 15 is that it can be readily adapted to utilize signals that might already exist in a gain control interface used to drive the interpolator shown in FIG. 4. Some examples of gain control interfaces are the ratiometric current generators described in the above-referenced U.S. Pat. No. 6,489,849 B1, also by the inventor of the present application. Complete details are provided in that patent, but an embodiment is shown in FIG. 16 for convenience.

Figure 16:
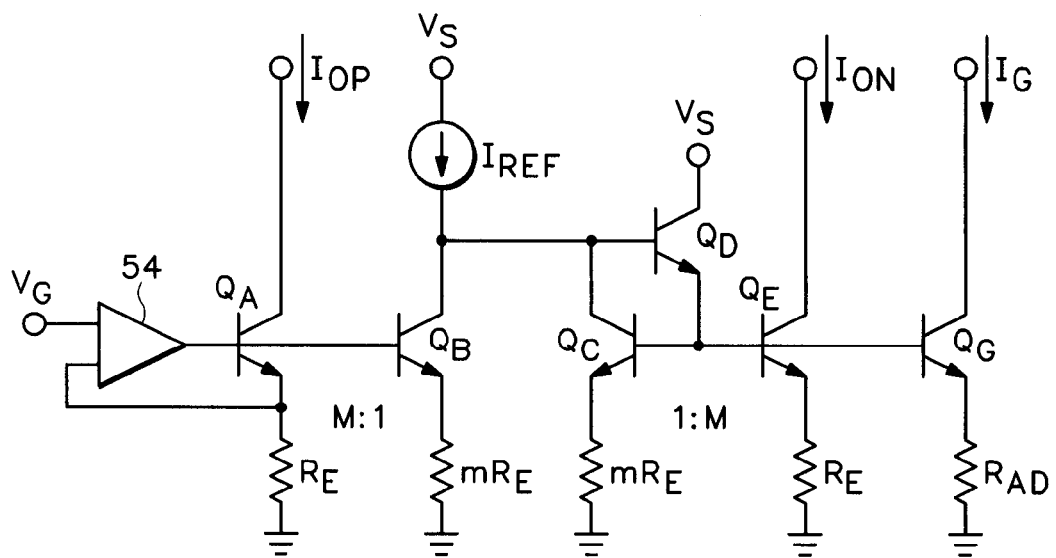
FIG. 16 illustrates a ratiometric gain interface suitable for driving the interpolators shown in FIGS. 4 and 5.

Referring to FIG. 16, the output signals IOP and ION, which are used to generate the control signal $V_{CTRL}$ in FIG. 5, vary ratiometrically in response to changes in the gain control signal $V_G$. Depending on the desired polarity, the signal $I_G$ can be generated by coupling a mirror transistor $Q_G$ to the base of either $Q_E$ (as shown here) or $Q_A$ (to achieve the opposite polarity). The signal $I_G$ can then be coupled to the exponential cell of FIG. 15 through a current mirror.

Thus, one of the advantages of an adaptive biasing scheme according to the inventive principles of the present patent disclosure is that it can be neatly integrated with a variable attenuation/gain system (with the added benefit of utilizing pre-existing signals) so as to bias the output stage in lock-step with the demands of the preceding stage, thereby reducing unnecessary current consumption in the output stage. As a further refinement, a resistor can be placed in series with the emitter of Q12 in the exponential cell of FIG. 15. At the lower end of the operating range, this resistor has little if any effect on $I_{SET}$, but at the higher end of the range, it begins to soften and eventually limit the exponential function so as to prevent the bias current in the output stage from becoming excessive.

Figure 17:
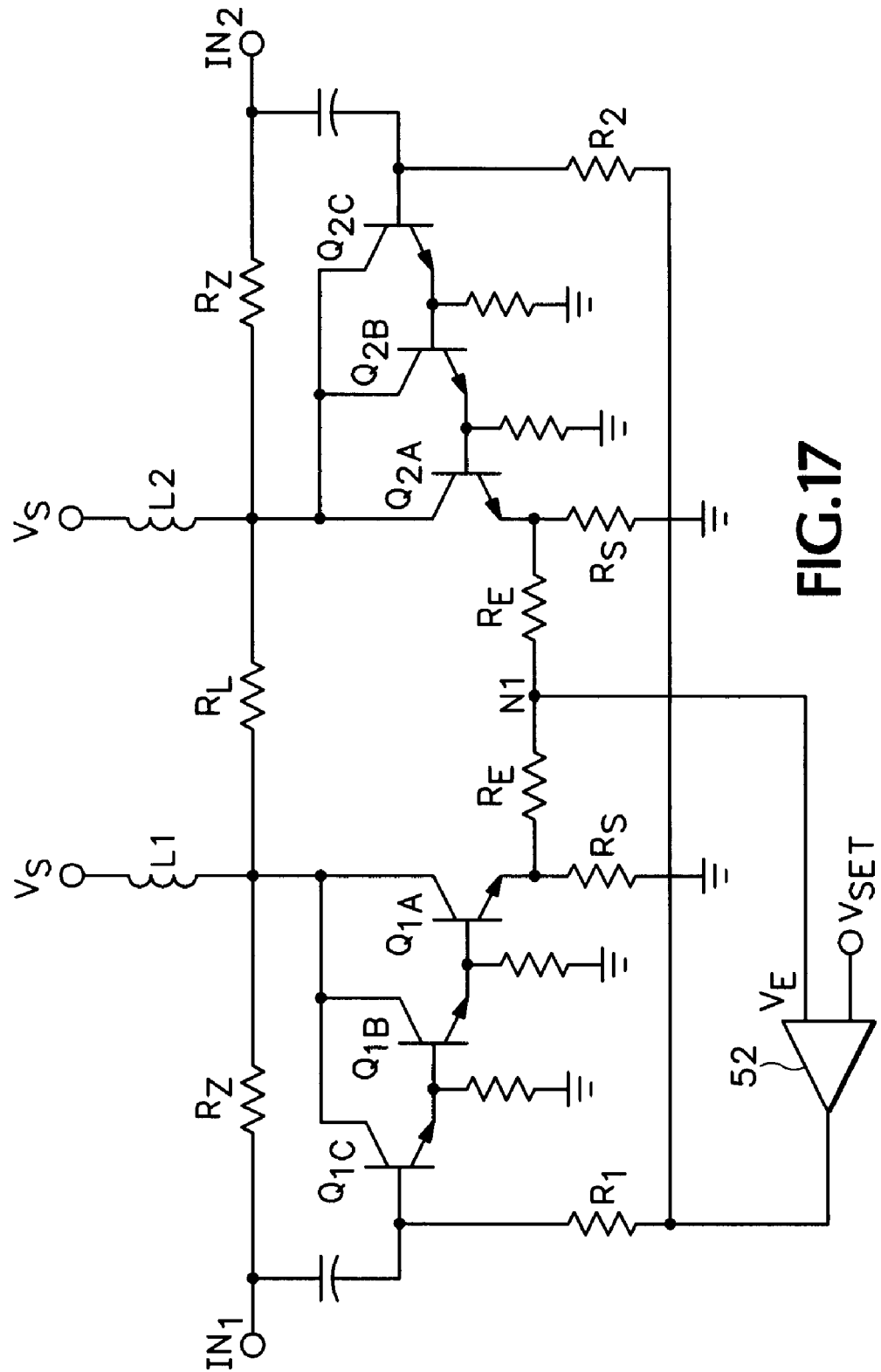
FIG. 17 illustrates an embodiment of a transimpedance amplifier and a scheme for interfacing it to a variable attenuation system in accordance with some additional inventive principles of this patent disclosure.

FIG. 17 illustrates an embodiment of a circuit that introduces some additional inventive principles for improving a transimpedance amplifier, and for interfacing it to a variable attenuation system in a synergistic manner.

An additional problem with the conventional transimpedance amplifier of FIG. 11 is that the individual transistor Q1 has a very low AC beta (on the order of about 5) at frequencies of 2 GHz and higher. Therefore, the circuit of FIG. 17 utilizes a Darlington-type arrangement of multiple transistors Q1A, Q1B,Q1C (the "Q1 group") and Q2A,Q2B,Q2C (the "Q2 group") to increase the open loop gain before adding any shunt feedback. The collectors of the transistors in each group are shown connected together in the traditional Darlington arrangement, but other connections can be used. For example, the collectors of Q1C and Q2C could be connected to the positive power supply to reduce the voltage drop across the Q1 and Q2 groups and to minimize the effect of the Miller capacitance ($C_{JC}$) that causes displacement currents to flow from the collector to the base of each of the transistors. However, if the "A", "B" and "C" transistors in each group are made progressively smaller, the displacement current in the C transistors will probably be insignificant, so the traditional Darlington arrangement may be used so as to obtain as much output drive current as possible.

The basic topology of the amplifier of FIG. 17 is similar to that of FIG. 12, but the emitters of Q1 and Q2 are now connected to ground through separate sense resistors $R_S$, and to each other through two small emitter degeneration resistors $R_E$. The current sensing voltage $V_E$ is still obtained at node N1 which is now located at the center point between the degeneration resistors $R_E$. This arrangement helps compensate for thermal effects which tend to cause an unequal distribution of current between the two groups of transistors. If one of the two groups becomes hotter than the other, the hotter group tends to conduct a disproportionate share of current. The arrangement shown in FIG. 17 improves the current distribution between the transistors despite any thermal imbalances that might exist. The introduction of emitter degeneration resistors also increases the linearity of the amplifier, but at the cost of reducing the voltage gain and increasing the input impedance ($Z_{IN}$). Depending on the specific application, however, these tradeoffs might be beneficial. For example, in the case of the input impedance, the slight increase in $Z_{IN}$ might be offset by the better thermal stability of $Z_{IN}$ which, in turn, improves the overall gain accuracy with changes in temperature.

Another inventive feature of the circuit of FIG. 17 is the arrangement of the feedback resistors $R_Z$ that set the transimpedance (in this case transresistance) of the amplifier. Rather than being connected directly back to the bases of $Q_1$ and $Q_2$, they are connected to the outputs of the attenuators. Coupling capacitors $C_1$ and $C_2$ then complete the AC path to the bases of $Q_1$ and $Q_2$. If the outputs of the attenuators are close to isopotential nodes on the attenuators (e.g., $V_{BIAS}$ in FIG. 4 or $V_{REF1}$ in FIG. 9), and the isopotential nodes are at a voltage close to the power supply voltage, then there is little or no DC voltage across resistors $R_Z$, and no bias current is wasted in this path.

As with the other embodiments described herein, the inventive principles illustrated in the embodiment of FIG. 17 are not limited to the particular details. A fully differential circuit is shown, but the same inventive principles can be applied to single-sided version. Likewise, a sense resistor is used to measure the current through the amplifier, but other current sensing schemes are acceptable.

Figure 18:
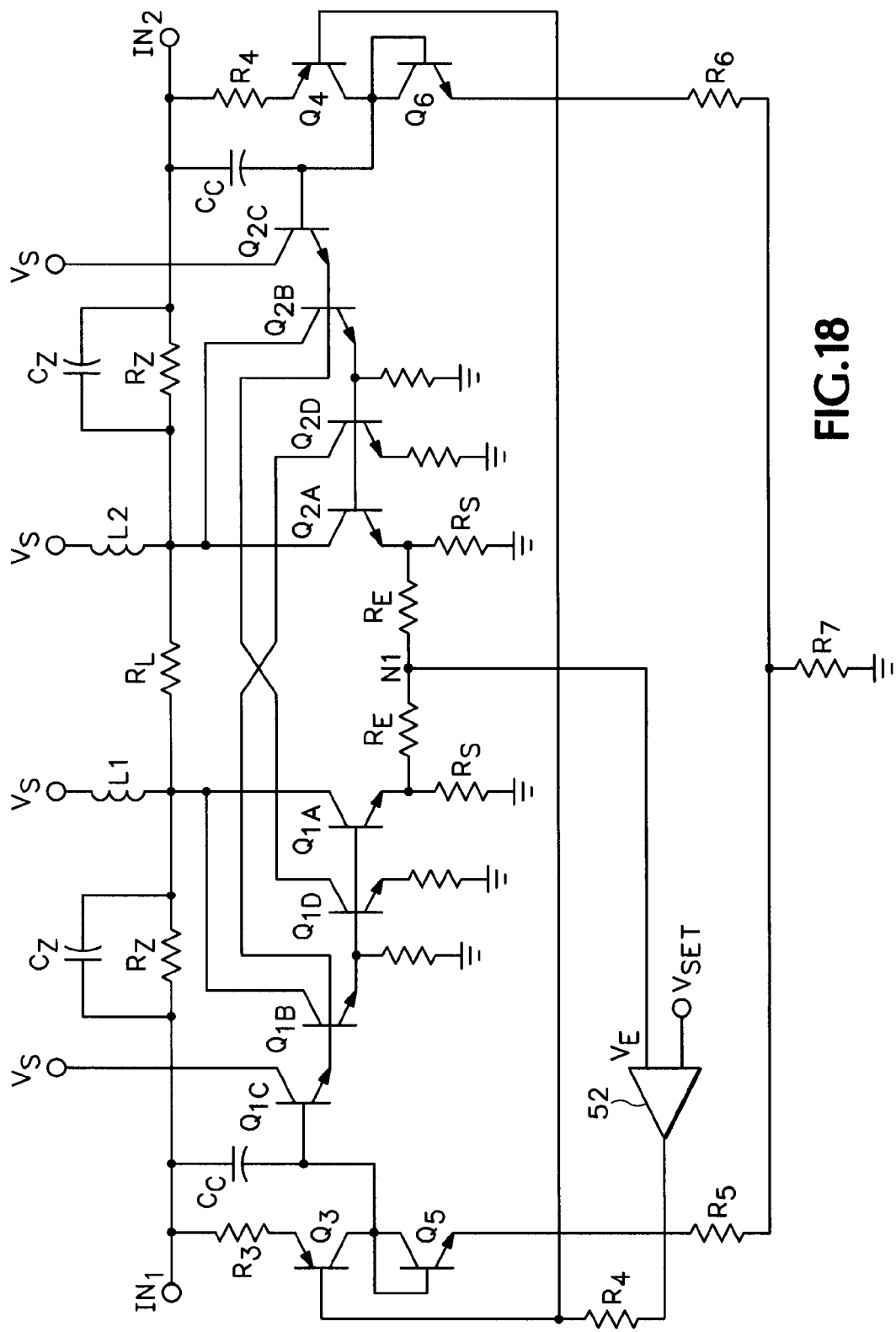
FIG. 18 illustrates another embodiment of an amplifier in accordance with some additional inventive principles of this patent.

FIG. 18 illustrates another embodiment of an amplifier in accordance with some additional inventive principles of this patent. The embodiment of FIG. 18 is somewhat similar to that of FIG. 17, but now additional transistors $Q_{1D}$ and $Q_{2D}$) are included to sample the current through $Q_{1A}$ and $Q_{2A}$, respectively. The collectors of $Q_{1D}$ and $Q_{2D}$ are cross-connected to the emitters of $Q_{2C}$ and $Q_{1C}$, respectively. This cross-connection biases $Q_{2C}$ and $Q_{1C}$ in a manner that may improve the linearity of the amplifier. In the embodiment of FIG. 17, which has the simpler arrangement of three emitter followers in series on each side, the $V_{BE}$ of each transistor varies as the input signal and output current varies. This may introduce unacceptable distortion in the output signal. In the embodiment of FIG. 18, however, the cross-connection helps cancel these effects.

Another inventive principle of the embodiment shown in FIG. 18 relates to providing DC input coupling. In the embodiment of FIG. 17, the effect of the input coupling capacitors $C_C$ diminishes at low frequency, so the amplifier begins to behave as an open-loop amplifier that may have unacceptable noise performance. The arrangement of transistors $Q_3$-$Q_6$ and resistors $R_3$-$R_7$ in FIG. 18 provide an alternative technique for biasing the amplifier and may allow for operation frequency all the way down to DC. Rather than connecting the adaptive bias amp 52 to the base of $Q_{1C}$ through R1, it is connected through a DC coupling arrangement of $Q_3$ and $R_3$ that provides DC coupling across the AC coupling capacitor $C_C$. Transistor Q4 and resistor $R_4$ are arranged in a similar configuration at the other input. The DC coupling arrangements are loaded by diode-connected transistors $Q_5$ and $Q_6$, and resistors $R_5$-$R_7$ as this may cancel any non-linearity that might be introduced by the DC coupling.

A further refinement to the circuit of FIG. 18 is the use of capacitors $C_Z$ which are connected across resistors $R_Z$. Capacitors $C_Z$ may be adjusted to set the output impedance of the amplifier to a suitable value, for example, 50Ω. The value of $C_Z$ may also interact with the capacitance of any input stage that may be connected to the amplifier as discussed below.

Current-Mode Cascode Drive

Some additional inventive principles of this patent relate to driving a steering core with current-mode signals. In the embodiment shown in FIG. 5, the interpolation signals are generated as current-mode signals $I_{PS1}, I_{PS2}, \ldots I_{PSn}$, then converted to voltage-mode signals $V_1, V_2, \ldots V_n$ by resistors $R_C$. The voltage-mode signals may then be used to drive the cascode transistors (the $Q_A$-$Q_B$ pairs) in the steering core shown in the embodiment of FIG. 4. In many applications, this may provide adequate performance, but the cascode transistors may be more sensitive to noise when driven by a voltage-mode signal. Therefore, to reduce noise sensitivity, the cascode transistors may be driven with current-mode signals.

One technique for current driving the steering core is to simply remove the resistors $R_C$ and drive the bases of the cascode transistors directly with the output currents from the current mirrors shown in FIG. 5. This may provide adequate performance, especially if there are only a few stages in the steering core. With a large number of stages, however, any leakage current from the collectors of the output transistors in the current mirrors towards the right-hand side of the attenuator in FIG. 4 might turn on the cascodes enough to introduce an unwanted signal that overwhelms the desired signal from stages towards the left. To overcome this potential problem, the resistors $R_C$ may still be included in the circuit to bleed off leakage current, but their resistance values are selected large enough so that the signals to the cascode transistors are still substantially current-mode.

Another potential problem with current driving the steering core is that the extent to which each of the cascode transistors are turned on depends on the transistor current gain which is typically a poorly controlled parameter. To overcome this potential problem, a steering core may utilize a servo arrangement to provide closed-loop control of the cascode base drive. An embodiment of such an arrangement according to the inventive principles of this patent disclosure is illustrated in FIG. 19.

Figure 19:
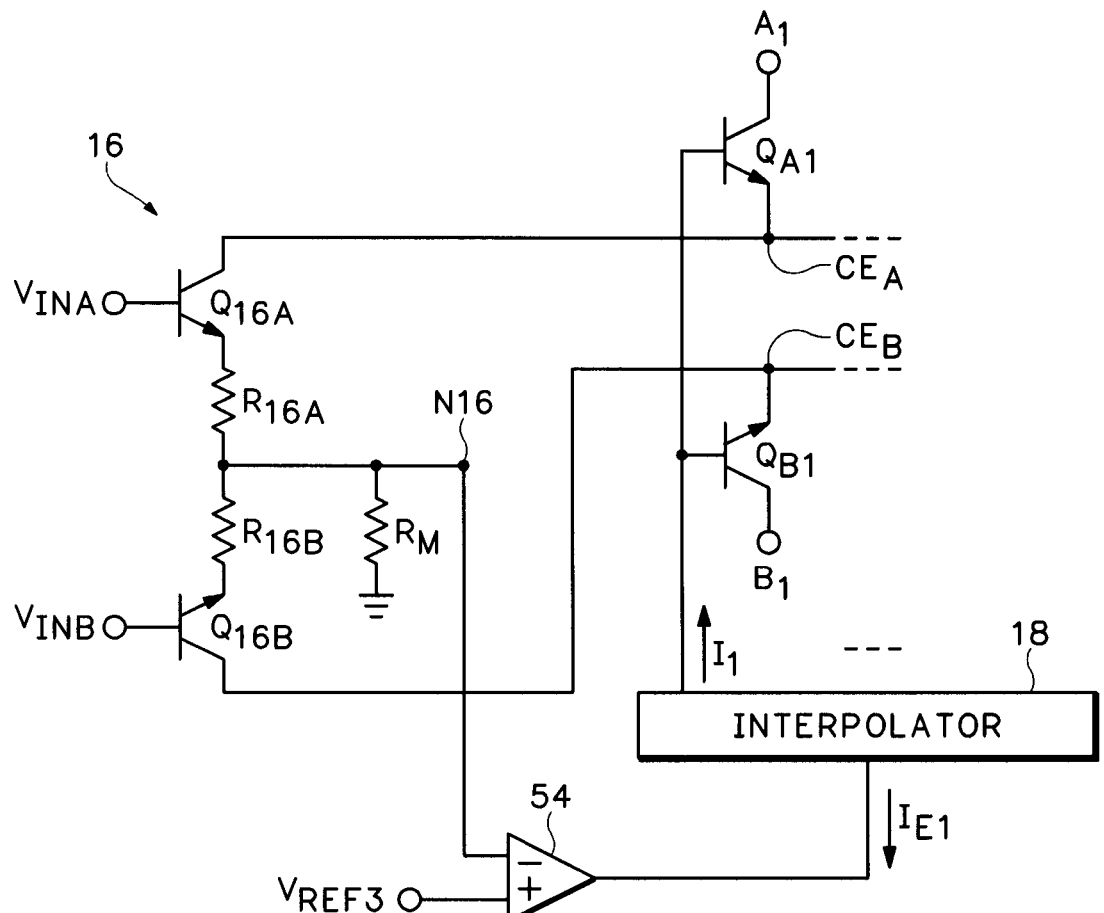
FIG. 19 illustrates an embodiment of a servo arrangement according to the inventive principles of this patent.

In the embodiment of FIG. 19, the steering core includes cascode transistors pairs $Q_{A1},Q_{B1}$; $Q_{A2},Q_{B2}$; etc., and an interpolator 18 as shown in FIG. 4, but now the interpolator drives the bases of the cascode transistors with current signals $I_1, I_2$, etc. The interpolator currents are generated by selectively steering the bias current $I_{E1}$ to the various interpolator outputs. An input stage 16 includes NPN transistors $Q_{16A}$ and $Q_{16B}$ which have their bases arranged to receive the input signals $V_{INA}$ and $V_{INB}$, respectively, and their collectors connected to common emitter nodes $CE_A$ and $CE_B$, respectively. For simplicity, the remaining structure of the steering core and attenuator is omitted. The emitters of $Q_{16A}$ and $Q_{16B}$ are connected to a node N16 through resistors $R_{16A}$ and $R_{16B}$, respectively. A monitor resistor $R_M$ is connected between node N16 and ground. The servo loop is completed by an op amp 54 that has its inverting input connected to N16, its noninverting input connected to a reference signal $V_{REF3}$, and its output arranged to generate the bias current $I_{E1}$.

The op amp 54 servoes the loop by generating whatever bias current $I_{E1}$ is required to force the voltage at node N16 to $V_{REF3}$, which in turn sets the current through $R_M$. Since the cascode transistors are within the servo loop, the loop automatically compensates for the current gain of the cascode transistors, as well as for mismatches between the various transistors.

Input Matching and Linearization

Some additional inventive principles of this patent relate to input impedance matching and/or input linearization. Although these principles will be described in the context of a variable attenuation system having continuous input steering, the inventive principles have independent utility and can be applied to other systems.

Figure 20:
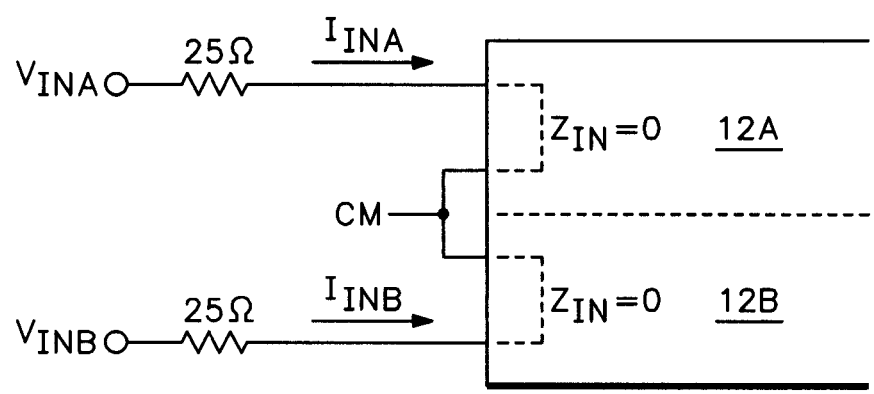
FIG. 20 illustrates a differential steering core with a termination arrangement according to the inventive principles of this patent.

As an aid to understanding the impedance matching and input linearization principles of this patent, FIG. 20 illustrates a differential steering core 12A, 12B with a termination arrangement for the input signal. The differential input signal $V_{INA}, V_{INB}$ is applied to the inputs of the steering core through two 25Ω resistors. The inputs of the steering core are anchored to a suitable common mode node CM. As a first-order approximation, the input impedance of each side of the steering core is assumed to be zero. Thus, the impedance seen looking into the steering core is 50Ω, which is a commonly used characteristic impedance for RF systems. This arrangement is inefficient, however, because the input signal is terminated rather than matched. That is, only the input current is utilized by the steering core, whereas the available input voltage is not, so only a portion of the power available in the input signal is transferred to the steering core.

Moreover, in a practical implementation, the input impedance of each side of the steering core may not be zero. For example, if cascode transistors such as those shown in the embodiment of FIG. 4 are used in the steering core, the incremental input resistance $r_e$ associated with the emitter of each transistor is seen looking into the steering core. This is a nonlinear resistance that varies with the signal current. Thus, the transistor input impedances may introduce a nonlinearity into the system which, in turn, may cause signal distortion.

Figure 21:
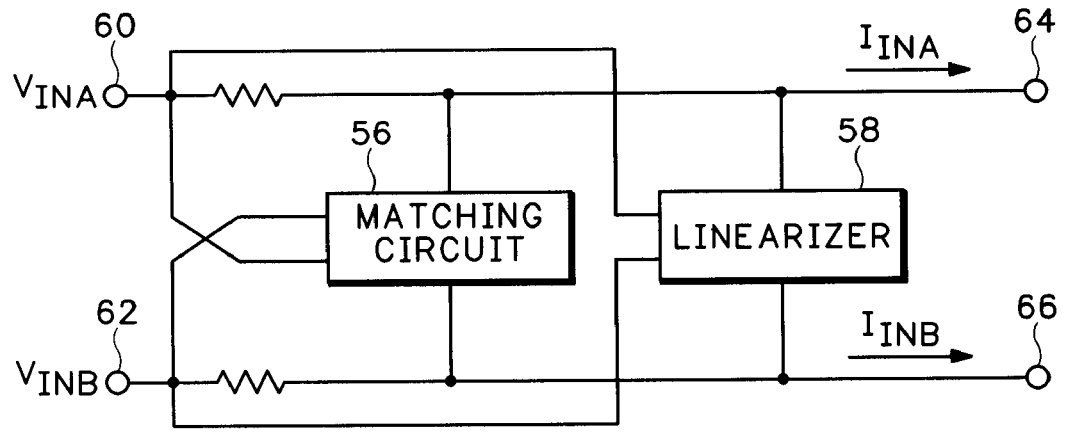
FIG. 21 illustrates an embodiment of an input system according to the inventive principles of this patent.

FIG. 21 illustrates an embodiment of an input system which may improve input matching and/or linearity according to the inventive principles of this patent. The differential input signal $V_{INA}$, $V_{INB}$ is applied to input terminals 60 and 62, respectively. Each of the input terminals is connected through a 25Ω resistor to one of two terminals 64 and 66 which may, for example, be connected to the input of a steering core to provide a differential input current $I_{INA}$, $I_{INB}$ thereto. A matching circuit 56 has two outputs connected to terminals 64 and 66, and two inputs which are cross-connected to terminals 60 and 62. The matching circuit is designed to sample the input voltage and use it to generate an additional current that contributes to $I_{INA}$, $I_{INB}$. The embodiment of FIG. 21 also includes a linearizer 58 which has two outputs connected to terminals 64 and 66, and two inputs connected to terminals 60 and 62. The linearizer is designed to sample the input voltage and use it to impart a distortion canceling correction into $I_{INA}$, $I_{INB}$. Although the system of FIG. 21 is shown with both a matching circuit 56 and a linearizer 58, each has utility and can operate independently of the other. They may also be implemented together in a manner that may provide additional benefits.

Figure 22:
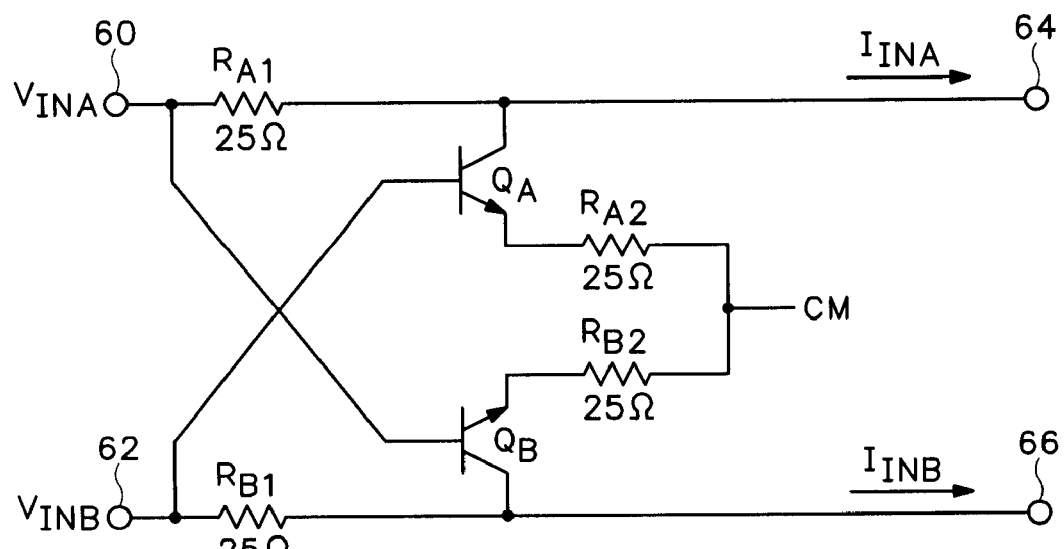
FIG. 22 illustrates an embodiment of a matching circuit according to the inventive principles of this patent.

FIG. 22 illustrates an embodiment of a matching circuit showing some example details according to the inventive principles of this patent. The matching circuit of FIG. 22 includes a pair of 25Ω resistors $R_{A1}$ and $R_{B1}$ connected between the input terminals 60 and 62 and the output terminals 64 and 66. The matching circuit also includes a pair of cross-coupled transistors $Q_A$ and $Q_B$, and an additional pair of 25Ω resistors $R_{A2}$ and $R_{B2}$. The collectors of $Q_A$ and $Q_B$ are connected to terminals 64 and 66, respectively, while their bases are cross-connected to input terminals 62 and 60, respectively. The emitter of each transistors is connected to a common mode node CM through one of the second pair of 25Ω resistors.

As with the circuit of FIG. 20, the current $I_{INA}$, $I_{INB}$ in the embodiment of FIG. 22 includes a component taken directly from the input nodes through $R_{A1}$ and $R_{B1}$. In addition to using the current from the input nodes, however, the matching circuit of FIG. 22 also provides power matching by utilizing the input voltage to provide an additional component to the current $I_{INA}$, $I_{INB}$. Thus, both the available current and voltage are utilized.

Figure 23:
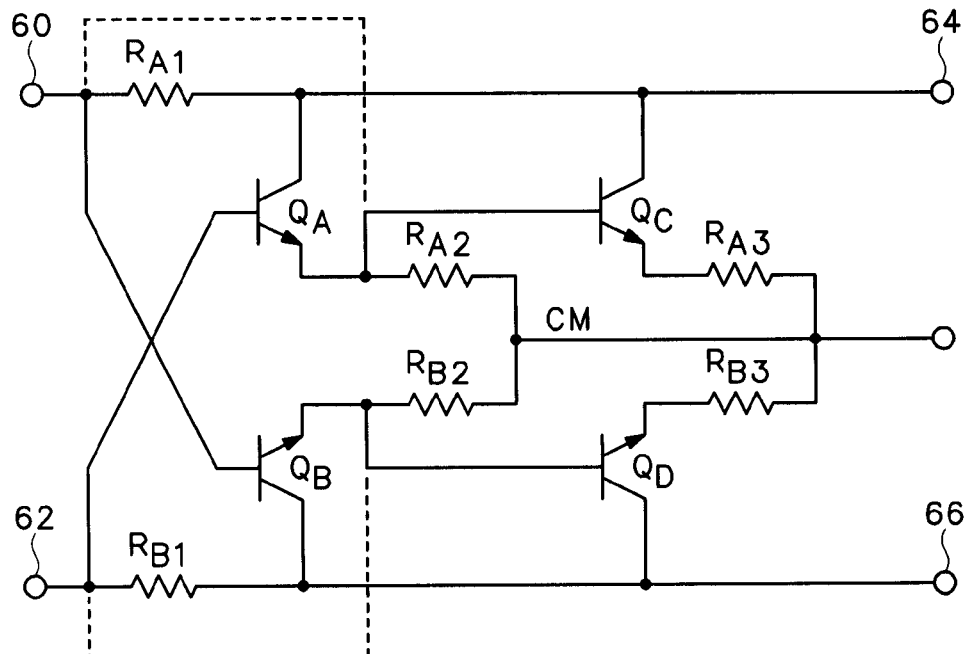
FIG. 23 illustrates an embodiment of a linearizer according to the inventive principles of this patent.

FIG. 23 illustrates an embodiment of a linearizer showing some example details according to the inventive principles of this patent. The linearizer of FIG. 23 includes transistors $Q_C$ and $Q_D$ which have their collectors connected to terminals 64 and 66, respectively, and their emitters connected to the common mode node CM through resistors $R_{A3}$ and $R_{B3}$, respectively. The bases of $Q_C$ and $Q_D$ may be connected directly to terminals 60 and 62, respectively. Alternatively, if a matching circuit such as that illustrated in FIG. 22 is included, the bases of $Q_C$ and $Q_D$ may be arranged to sense the input voltage through the emitters of $Q_A$ and $Q_B$ as shown with the dotted-lines connections in FIG. 23. This arrangement may allow for lower standing currents in $Q_C$ and $Q_D$.

As a further refinement, the values of $R_{A1}$ and $R_{B1}$ may be set to 25Ω minus $r_e$ at some nominal value of signal current to compensate for the input impedance of cascode transistors that may be used in, for example, a steering core connected to the linearizer. It should also be noted that resistors $R_{A1}$ and $R_{B1}$ and $R_{A2}$ and $R_{B2}$ are illustrated as 25Ω resistors because they combine to form a 50Ω characteristic impedance which is widely used in RF systems. The inventive principles of this patent, however are not limited to resistors having these specific values, and any other suitable values may be used.

Figure 24:
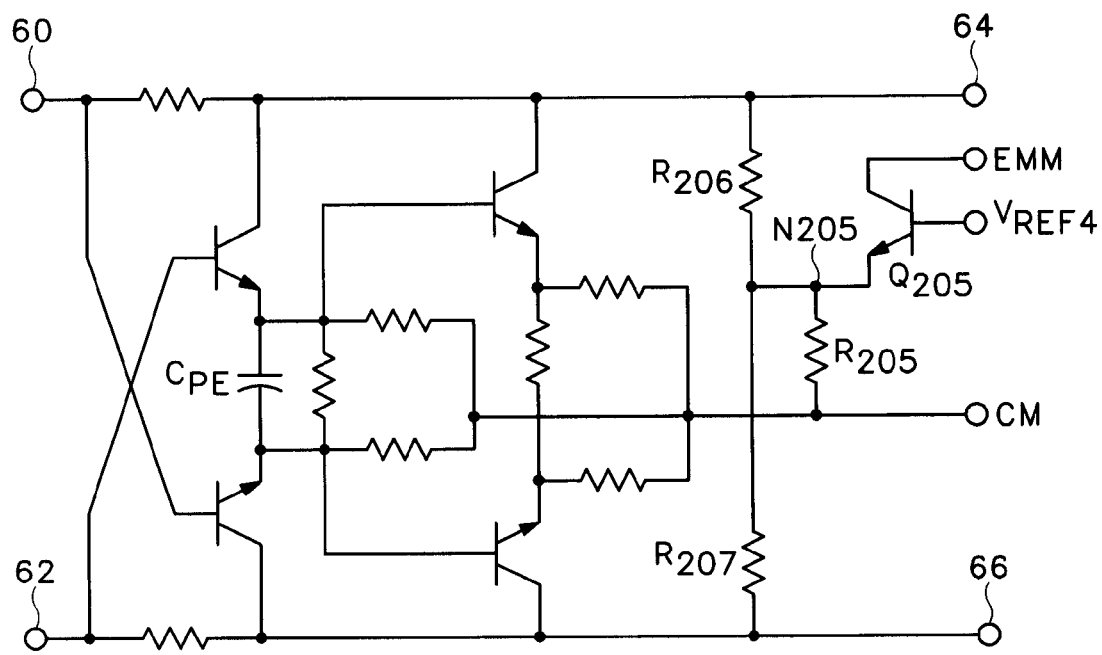
FIG. 24 illustrates an embodiment of an input system according to the inventive principles of this patent.

FIG. 24 illustrates an embodiment of an input system that combines impedance matching and input linearization with closed-loop servo control of cascode base drive according to the inventive principles of this patent. The embodiment of FIG. 24 includes a matching circuit and a linearizer similar to those shown in FIG. 23. The embodiment of FIG. 24, however, also includes a transistor $Q_{205}$ which may be arranged to operate as the op amp 54 that generates the interpolator bias current $I_{E1}$ as shown in FIG. 19. The emitter of $Q_{205}$ is connected to a node $N_{205}$ at the midpoint of a resistive divider $R_{206}$, $R_{207}$ which is connected between the input terminals 64,66 of, for example, a steering core. A resistor $R_{205}$ is connected between $N_{205}$ and a common mode point CM. The base of $Q_{205}$ is connected to a reference signal $V_{REF4}$, which is preferably set to a matched $V_{BE}$ above an accurate reference voltage so that node $N_{205}$ is maintained at the accurate reference voltage. The interpolator bias current $I_{E1}$ may be coupled directly into the collector of $Q_{205}$, in which case the bias current is set by the value of $R_{205}$ as opposed to resistor $R_M$ in the embodiment of FIG. 19.

A further refinement illustrated in the embodiment of FIG. 24 is the use of a pre-emphasis capacitor $C_{PE}$ connected between the emitters of QA and QB. This capacitor may change the gain of the matching circuit at high frequencies to improve noise performance, and may also make the input impedance flatter over a wide frequency range.

Figure 25:
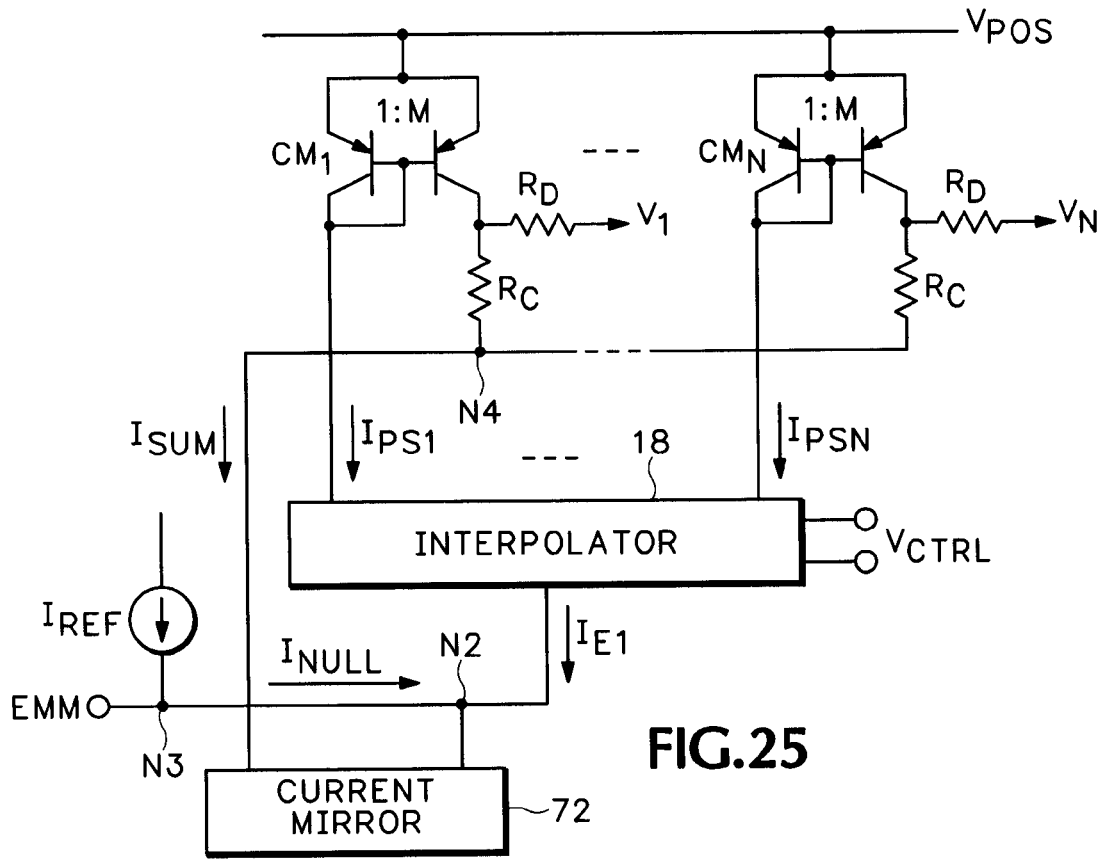
FIG. 25 illustrates another embodiment of an arrangement for providing servo control of interpolator signals according to the inventive principles of this patent.

FIG. 25 illustrates another embodiment of an arrangement for providing servo control of interpolator signals according to the inventive principles of this patent. Rather than generating the interpolator bias current $I_{E1}$ directly from $Q_{205}$ as is illustrated in FIG. 24, $I_{E1}$ is instead directed to one input of a current mirror 72. A summation current $I_{SUM}$ is directed to the other input to the current mirror. $I_{SUM}$ is generated by summing the currents from resistors $R_C$ at node N4. As discussed above, resistors $R_C$ are intended to prevent leakage current from the current mirrors from turning on transistors in the steering core. They may also be used, however, to provide a measure of the interpolator current.

A reference current $I_{REF}$ is directed into the EMM terminal at node N3 which is also connected to a node N2 between the interpolator bias input and the current mirror. This current mirror arrangement can be thought of as a current-mode op amp that nulls the current $I_{NULL}$ flowing between nodes N2 and N3. By balancing the $I_{E1}$ and $I_{SUM}$, the uncertainty in $I_{E1}$ is eliminated, and its accuracy may be determined by $I_{REF}$. This arrangement may also eliminate inaccuracies caused by variations in the base-emitter voltage of $Q_{205}$ in FIG. 24.

A further refinement illustrated in the embodiment of FIG. 25 is the use of series resistors $R_D$ between the current mirrors and the bases of the cascode transistors in the steering core. These resistors may improve the common mode rejection, especially at high frequencies, by reducing the effect of any capacitance associated with the current mirrors. In this example it should be noted that, although the interpolator signals are designated as V1, V2, ... V3 for consistency with other drawings, they are actually current-mode signals.

Gain Interface Accuracy and Limiting

Some additional inventive principles of this patent relate to improving the accuracy of a gain interface and/or limiting the output of a gain interface under certain conditions. These inventive principles have independent utility from the other inventive principles of this patent and can be applied to other systems.

As discussed above, FIG. 16 illustrates a ratiometric gain control interface that may be used to drive an interpolator such as that shown in FIG. 5. The ratio of the control currents $I_{OP}$ and $I_{ON}$ can be made very accurate by matching transistors $Q_A$ and $Q_E$ so that the effects of their alphas cancel. The absolute scaling of the currents, however, is dependent upon the reference current $I_{REF}$ which is subject to an alpha that is not cancelled when it is introduced into the circuit.

Figure 26:
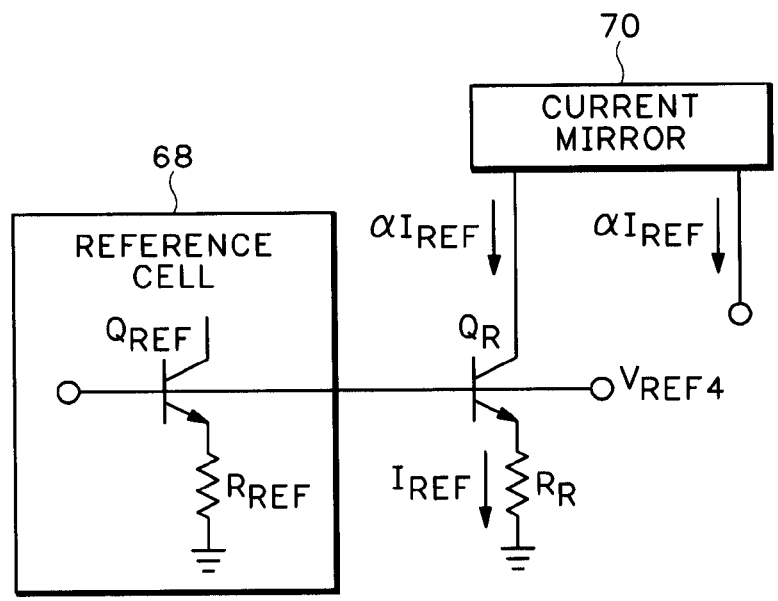
FIG. 26 illustrates a reference current source according to the inventive principles of this patent.

FIG. 26 illustrates a reference current source according to the inventive principles of this patent. The current source of FIG. 26 includes a reference cell 68 that generates an accurate reference signal $V_{REF5}$ across an emitter resistor $R_{REF}$ which is connected to the emitter of a reference transistor $Q_{REF}$. The base of $Q_{REF}$ is connected to the base of a replication transistor $Q_R$ which also has an emitter resistor $R_R$. This forces a current in the emitter of $Q_R$ which may be referred to as a "true" $I_{REF}$. Due to the alpha of $Q_R$, however, the collector current through $Q_R$ will now be alpha times $I_{REF}$ or "$\alpha I_{REF}$". The current $\alpha I_{REF}$ may then be transferred to the gain interface of FIG. 16 through a preferably high-accuracy current mirror 70 and used in place of the "true" $I_{REF}$ previously used in the circuit. Thus, by substituting $\alpha I_{REF}$ for $I_{REF}$, the scaling of the gain interface may be made independent of alpha.

The voltage at the base of $Q_R$ may also be used as a convenient source for a reference signal for other purposes, for example, $V_{REF4}$.

In the circuit of FIG. 16, the current $I_{ON}$ through $Q_E$ is inherently limited when the gain control signal $V_G$ reaches one end of its range because $I_{REF}$ has a fixed value, and $Q_E$ can sink no more than a scaled version of $I_{REF}$. However, the current $I_{OP}$ through $Q_A$ may continue to increase even after the gain control signal $V_G$ has reached some nominal maximum value because op amp 54 can continue to increase the base drive to $Q_A$ even after $Q_E$ has consumed all of $I_{REF}$.

One technique according to the inventive principles of this patent that may prevent IOP from continuing to rise after $V_G$ has reached a certain value is to sense when the current through $Q_C$ or $Q_E$ reaches zero, and then prevent further increases to the base drive of $Q_A$. Sensing the current through $Q_C$ or $Q_E$ may be accomplished through any suitable technique, but one particularly useful technique is to sense the voltage at the common collector node $N_{CC}$ at the collectors of $Q_B$ and $Q_C$. This is easy to implement because the voltage at node $N_{CC}$ collapses as the current through $Q_C$ reaches zero.

Figure 27:
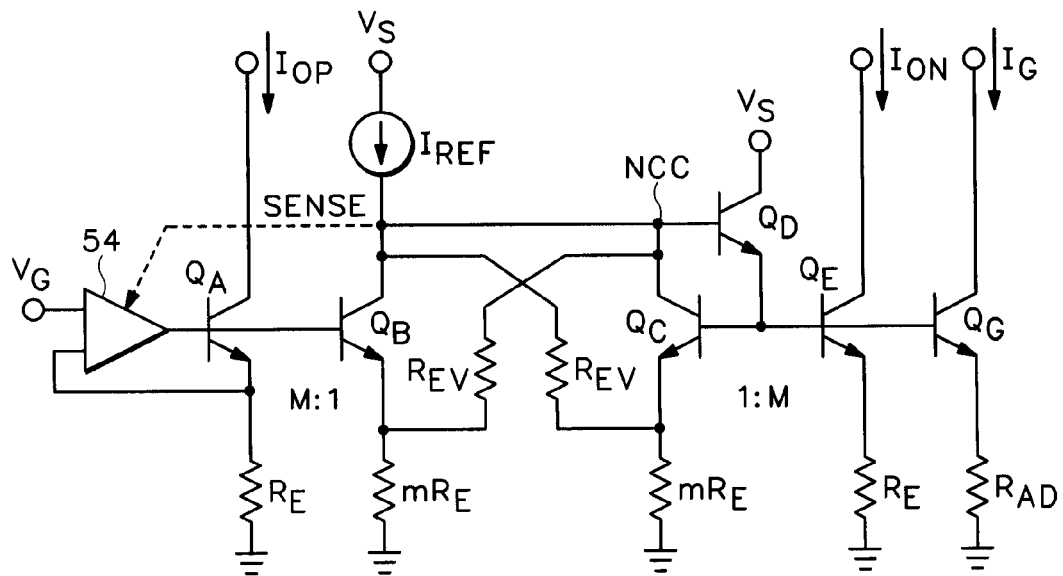
FIG. 27 illustrates an embodiment of a gain control interface according to the inventive principles of this patent.
Figure 28:
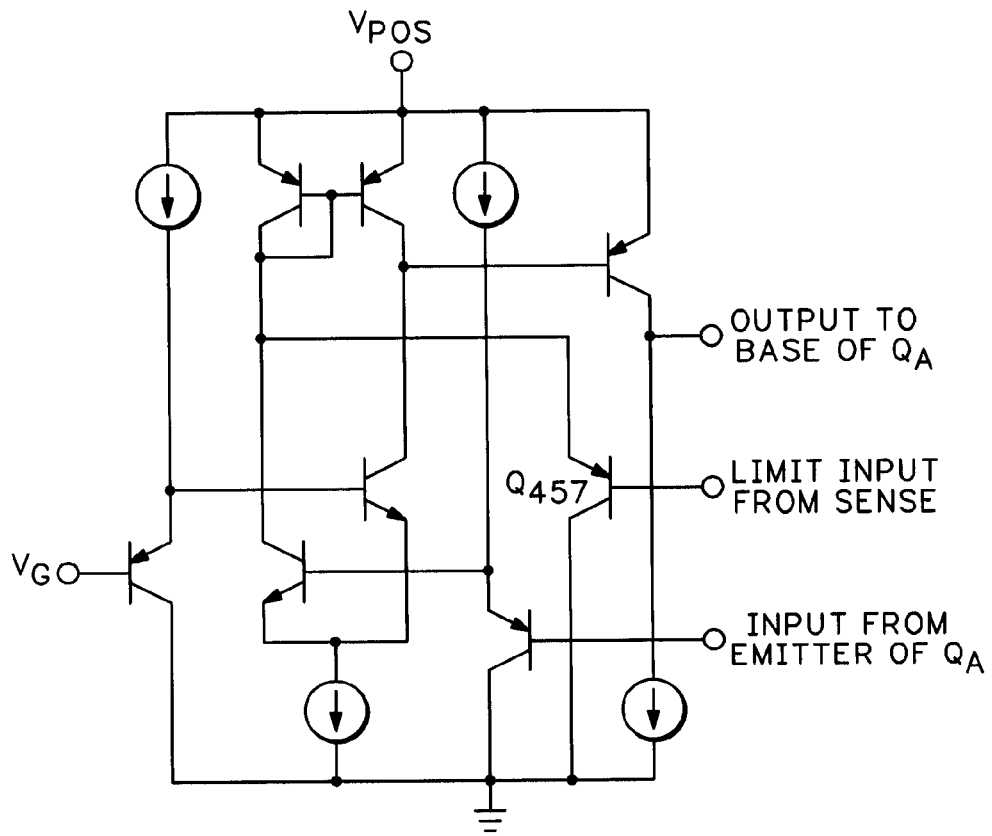
FIG. 28 illustrates an embodiment of an operational amplifier arranged to divert drive current from an output stage in response to a sense signal according to the inventive principles of this patent.

FIG. 27 illustrates an embodiment of a gain control interface according to the inventive principles of this patent. The current source of FIG. 27 is similar to that of FIG. 16 but includes a SENSE connection from the common collector node $N_{CC}$ to the op amp 54. The op amp is constructed and arranged so that it stops increasing the base drive to $Q_A$ when it senses the voltage at node $N_{CC}$ dropping off. This may be implemented, for example, by diverting drive current from an output stage of the op amp in response to the SENSE signal as shown in the embodiment of an op amp illustrated in FIG. 28.

The embodiment of FIG. 27 also includes a pair of resistors $R_{EV}$ cross-connected between the emitters and collectors of $Q_B$ and $Q_C$ to cancel the Early voltage effect in these devices.

Vector Modulator

Figure 29:
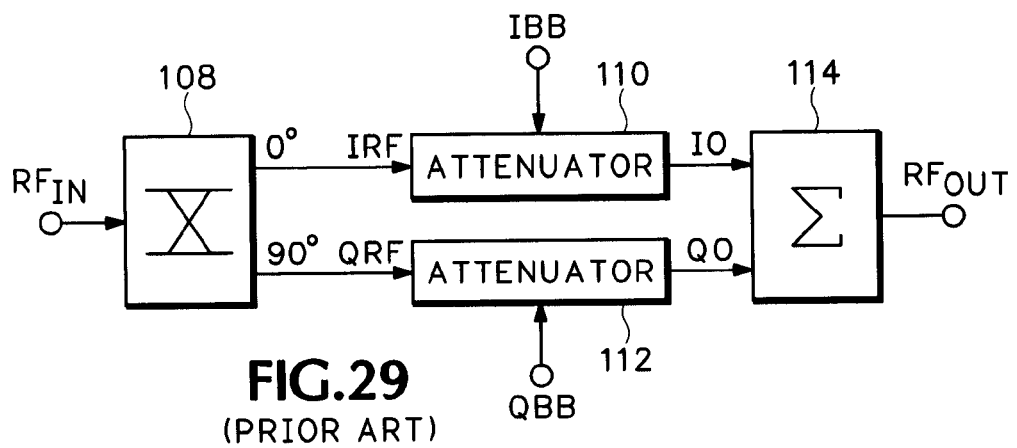
FIG. 29 illustrates a prior art vector modulator.

Variable attenuation systems having continuous input steering according to the inventive principles of this patent disclosure may be used to implement vector or quadrature modulators and vector multipliers. FIG. 29 illustrates a prior art vector modulator. A phase splitter 108 receives an input signal $RF_{IN}$ and splits it into in-phase (I) and quadrature (Q) components IRF and QRF, respectively. The phase splitter may be implemented with any suitable component, for example, a polyphase network or a quadrature coupler. The in-phase component is attenuated by a variable attenuator 110 in response to an I-side base band signal IBB, while the quadrature component is attenuated by another variable attenuator 112 in response to a Q-side base band signal QBB. A combiner 114, which is frequently implemented as a summing circuit, receives the outputs from the attenuators and generates the final output $RF_{OUT}$. If the phase splitter is omitted, the circuit would generally be referred to as a vector multiplier rather than modulator.

In microwave implementations, the variable attenuators 110 and 112 are typically realized with PIN diodes or absorptive attenuators, or with other forms of digital or analog attenuators. The attenuators have also been implemented more generically as active mixers or multipliers based, for example, on translinear circuits such as Gilbert-cell designs.

Figure 30:
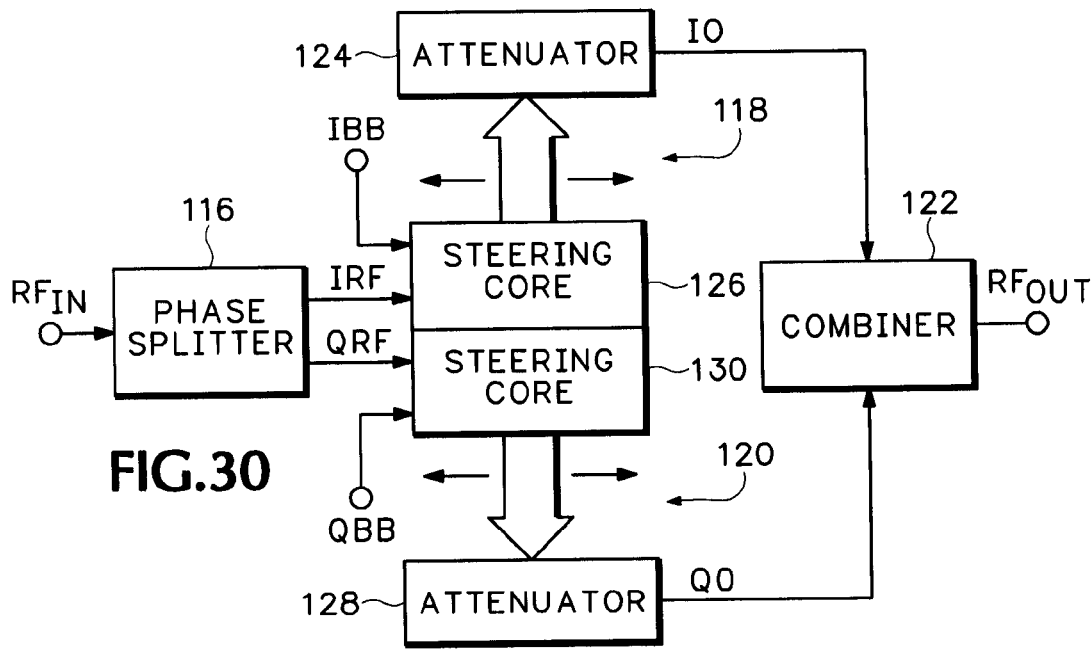
FIG. 30 illustrates an embodiment of a vector modulator according to the inventive principles of this patent disclosure.

FIG. 30 illustrates an embodiment of a vector modulator according to the inventive principles of this patent disclosure. The embodiment of FIG. 30 includes a phase splitter 116 and combiner 122 that are similar to those of the prior art circuit of FIG. 29. However, the conventional attenuators have been replaced by variable attenuator arrangements 118 and 120 that are implemented with continuous input steering according to the inventive principles of this patent disclosure. In this example, the I-side channel 118 includes an attenuator 124 having multiple inputs and an output connected to the combiner 122. A first steering core 126 continuously steers the I-side RF component signal to the inputs of the attenuator 124 under control of the I-side baseband signal IBB. The Q-side channel includes a second attenuator 128 and a second steering core 130 to variably attenuate the Q-side RF component signal under control of the Q-side baseband signal QBB.

If the steering cores are implemented as discrete components, for example, as a series of cascode transistors, then steering core on each side would most likely need a separate interpolator associated with it to generate a series of interpolator signals to control the steering core in response to the corresponding baseband input. Although attenuators 124 and 128 may be implemented with any suitable scaling or arrangement, in a vector modulator it may be most effective to use linear scaling as opposed to linear-in-dB (exponentially responding) scaling for the attenuators.

Figure 31:
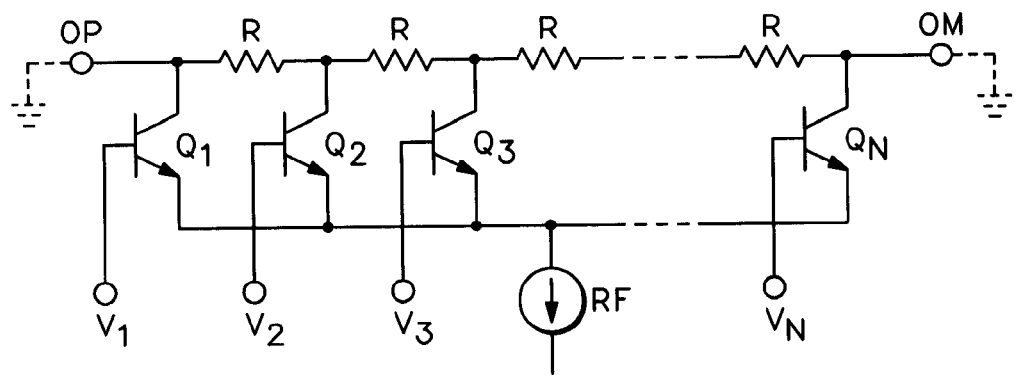
FIG. 31 illustrates an embodiment of a variable attenuation system according to the inventive principles of this patent disclosure.

FIG. 31 illustrates an fully discrete embodiment of a variable attenuation system according to the inventive principles of this patent disclosure. Although the embodiment of FIG. 31 is not limited to any particular application, it may be particularly effective for use as the variable attenuators 118 and 120 in the embodiment of FIG. 30.

In the embodiment of FIG. 31, the attenuator includes a linear scaled network of resistors R connected between output terminals OP and OM with the nodes between resistors serving as input terminals. The steering core includes cascode transistors Q1 ... QN arranged to steer the input signal RF to the attenuator inputs in response to interpolator signals $V_1 \ldots V_N$ which may be generated by a first-rank interpolator to implement spatial amplification with the cascode transistors also serving as the second interpolator rank.

If the embodiment of FIG. 31 is used for the I-side channel in the embodiment of FIG. 30, IRF may be used as the input signal RF, in which case IBB becomes the input to an interpolator that generates $V_1 \ldots V_N$. OP or OM may be used individually as IO in single-ended form, or together as a differential version of IO. A similar arrangement could then be used for the QRF, QBB and QO signals on the Q-side channel.

The output may be taken from the attenuator in any suitable manner, but a particularly useful technique may be to maintain OP and OM at virtual ground and take the currents out of OP and OM as a differential current mode signal. For example, an op amp may be connected in inverting mode to each of the OP and OM terminals, with the noninverting (+) input of each op amp anchored at ground. The outputs of the op amps would then provide a fully-differential voltage-mode signal with two-quadrant operation. As the centroid moves from one end of the attenuator to the other in response to the interpolator currents, the output signal swings from maximum positive to maximum negative with zero output point when the centroid is at the center of the attenuator.

Figure 32:
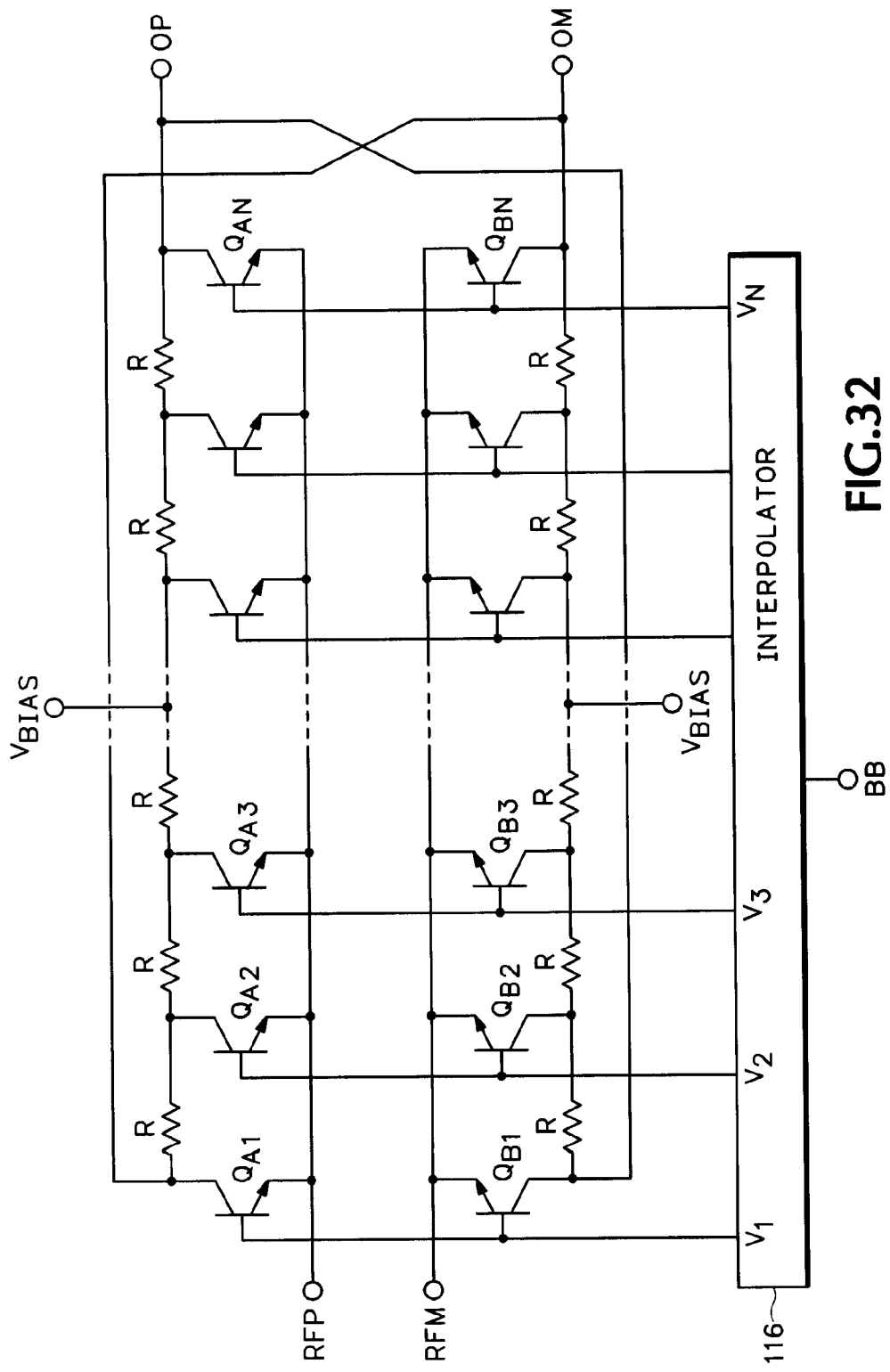
FIG. 32 illustrates another embodiment of a variable attenuation system according to the inventive principles of this patent disclosure.

Providing four-quadrant operation may require cross-connecting transistor bases in a complex arrangement that may be difficult to lay out on an integrated circuit. Splitting the collector network into two separate networks as shown in FIG. 32, however, may simplify the layout. The embodiment of FIG. 32 includes two separate steering cores and attenuators, each attenuator having two separate outputs. The outputs from the individual attenuators are cross-connected at output terminals OP and OM to provide full, four-quadrant operation. The input signal is applied differentially at RFP and RFM to the steering cores, which in this example, are implemented as cascode transistors QA1 . . . QAN and QB1 . . . QBN. The two individual steering cores share a common interpolator 116 which is controlled by a baseband signal BB.

The attenuators may be center tapped and anchored to a reference voltage $V_{BIAS}$ as shown in the embodiment of FIG. 32. If the center tap terminals are driven symmetrically relative to the endpoints OP and OM, it may provide increased accuracy in the zero output point. For example, the center tap terminals may be held at a constant voltage relative to OP and OM, e.g., a positive supply voltage $V_S$.

Although, for convenience, some of the embodiments of vector modulators and attenuators are described above with RF and baseband signals, the inventive principles are not limited to any particular frequency range or application. Likewise, embodiments have been illustrated with NPN-type bipolar junction transistors (BJTs), but any other type of current-control devices including FETs may be used according to the inventive principles.

Each of the inventive principles disclosed above has independent utility. Moreover, some or all of these principles can be combined in a synergistic manner to create a robust, high-power output stage capable of operating at frequencies well into the multiple-GHz range with low noise, low intermodulation and high linearity.

Some of the embodiments disclosed in this patent disclosure have been described with specific signals implemented as current-mode or voltage mode signals, but the inventive principles also contemplate other types of signals, whether characterized as voltages, currents, or otherwise. Likewise, some semiconductor regions are described as being specifically N-type, P-type etc., but different polarities can be utilized. And although some of the specific device layout geometries have been shown for purposes of illustrating the preferred embodiments, numerous other structures are possible, and yet others can be devised in accordance with the inventive principles of this patent disclosure.

Numerous inventive principles have been described above, and each has independent utility. In some cases, additional benefits are realized when the principles are utilized in various combinations with one another.

Thus, the embodiments described herein can be modified in arrangement and detail without departing from the inventive concepts. Accordingly, such changes and modifications are considered to fall within the scope of the following claims.

The invention claimed is:

1. A variable attenuation system comprising:
   a discrete attenuator having multiple inputs and two outputs; and
   a steering core to continuously steer an input signal to the multiple inputs of the attenuator to provide variable attenuation;
   wherein the outputs of the attenuator comprise virtual grounds that are held at fixed potential regardless of the amount of current flowing through the outputs.

2. The system of claim 1 wherein the discrete attenuator comprises a center tap driven symmetrically relative to the two outputs of the discrete attenuator.

3. The system of claim 2 wherein the center tap is held at a constant potential relative to the two outputs of the discrete attenuator.

4. The system of claim 1 wherein the discrete attenuator comprises a linear resistor network coupled between the two outputs.

5. The system of claim 1 further comprising an interpolator coupled to the steering core to control the steering core in response to a control signal.

6. The system of claim 1 wherein the steering core comprise cascode transistors.

7. The system of claim 1 further comprising an operational amplifier arranged to maintain one of the outputs of the attenuator at a virtual ground.

8. The system of claim 7 wherein the operational amplifier is arranged to convert a current at the one output of the attenuator to a voltage.

9. The system of claim 1 where the input signal comprises an input current.

10. The system of claim 1 where the steering core is arranged to steer the input signal in response to one or more interpolation signals.

* * * * *